US012617993B2

(12) United States Patent (10) Patent No.: US 12,617,993 B2
Beniya et al. (45) Date of Patent: May 5, 2026

(54) STRUCTURE BODY, DEVICE, AND METHOD FOR MANUFACTURING STRUCTURE BODY

(71) Applicant: KABUSHIKI KAISHA TOYOTA CHUO KENKYUSHO, Nagakute (JP)

(72) Inventors: Atsushi Beniya, Nagakute (JP); Shougo Higashi, Nagakute (JP)

(73) Assignee: KABUSHIKI KAISHA TOYOTA CHUO KENKYUSHO, Nagakute (JP)

( * ) Notice: Subject to any disclaimer, the term of this patent is extended or adjusted under 35 U.S.C. 154(b) by 1149 days.

(21) Appl. No.: 17/575,859

(22) Filed: Jan. 14, 2022

(65) Prior Publication Data

US 2022/0372358 A1 Nov. 24, 2022

(30) Foreign Application Priority Data

May 18, 2021 (JP) ................................. 2021-084075

(51) Int. Cl.
| | |
|---|---|
| *C09K 5/14* | (2006.01) |
| *C09C 1/00* | (2006.01) |
| *C09C 3/06* | (2006.01) |
| *C23C 14/08* | (2006.01) |
| *C23C 14/20* | (2006.01) |
| *C23C 14/34* | (2006.01) |
| *F22B 1/00* | (2006.01) |

(52) U.S. Cl.
CPC ................. *C09K 5/14* (2013.01); *C09C 1/00* (2013.01); *C09C 3/066* (2013.01); *C23C 14/087* (2013.01); *C23C 14/205* (2013.01); *C23C 14/34* (2013.01); *F22B 1/00* (2013.01);

*C01P 2004/02* (2013.01); *C01P 2004/03* (2013.01); *C01P 2004/04* (2013.01); *C01P 2004/16* (2013.01); *C01P 2006/32* (2013.01)

(58) Field of Classification Search
None
See application file for complete search history.

(56) References Cited

U.S. PATENT DOCUMENTS

| | | | | |
|---|---|---|---|---|
| 12,048,900 | B2 * | 7/2024 | Higashi | .................... B01J 35/39 |
| 2010/0239794 | A1 * | 9/2010 | Andrews | ................ H05K 3/046 |
| | | | | 428/32.72 |
| 2020/0254395 | A1 | 8/2020 | Higashi et al. | |

FOREIGN PATENT DOCUMENTS

| | | |
|---|---|---|
| JP | 2006-14965 A | 1/2006 |
| JP | 2008-6276 A | 1/2008 |
| WO | 2019/049996 A1 | 3/2019 |

OTHER PUBLICATIONS

Jul. 25, 2023 Office Action Issued in Japanese Patent Application No. 2021-084075.

(Continued)

*Primary Examiner* — Arti Singh-Pandey
(74) *Attorney, Agent, or Firm* — OLIFF PLC

(57) ABSTRACT

A structure body includes a free-standing structure including a fibrous member and/or a shell. The fibrous member and/or a shell are each a layered body formed of at least one light-absorbing layer and at least one dielectric layer. The light-absorbing layer includes a light-absorbing material that has an absorption in a visible light region, and the dielectric layer includes a dielectric material. The fibrous member and/or the shell have a three-dimensionally continuous configuration.

20 Claims, 11 Drawing Sheets

(56) References Cited

OTHER PUBLICATIONS

Zhou et al., "Self-Assembly of Highly Efficient, Broadband Plasmonic Absorbers for Solar Steam Generation," Science Advances, vol. 2, No. 4, e1501227, (2016).
Ren et al., "Hierarchical Graphene Foam for Efficient Omnidirectional Solar-Thermal Energy Conversion," Advanced Materials, 1702590, (2017).
Ghasemi et al., "Solar Steam Generation By Heat Localization," Nature Communications, vol. 5, (2014).
Zhu et al., "Plasmonic Wood for High-Efficiency Solar Steam Generation," Advanced Energy Materials, 1701028, (2017).
Zhou et al., "3D Self-Assembly of Aluminium Nanoparticles for Plasmon-Enhanced Solar Desalination," Nature Photonics, vol. 10, (2016).

* cited by examiner

Fig. 3A
Vapor deposition of
marterial of layered
body
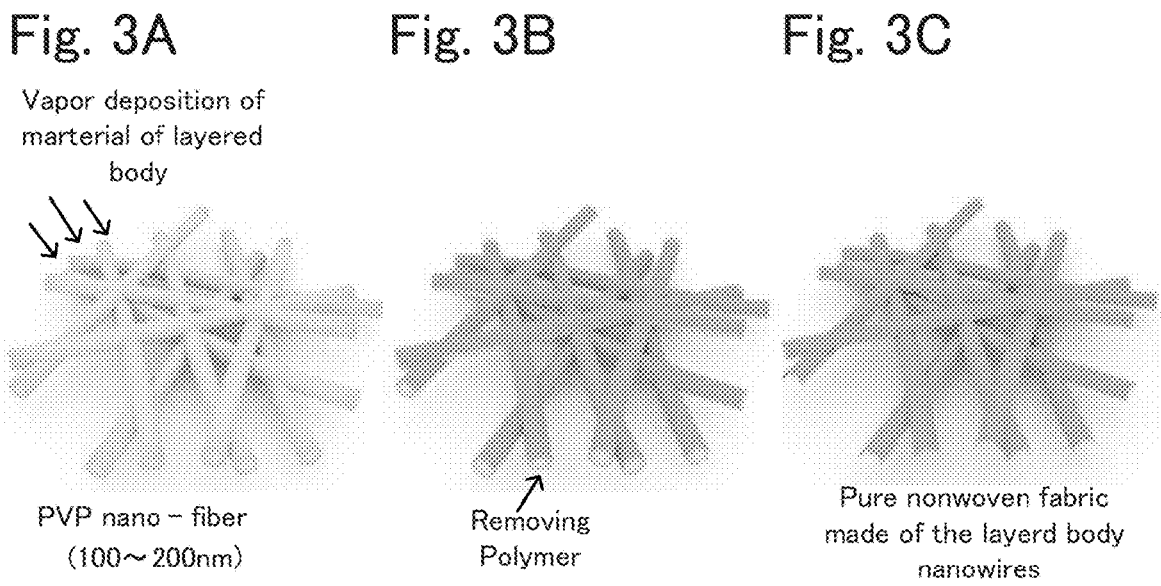
PVP nano – fiber
(100~200nm)
Fig. 3B
Removing
Polymer
Fig. 3C
Pure nonwoven fabric
made of the layerd body
nanowires
Fig. 4A    Fig.4B    Fig. 4C    Fig.4D
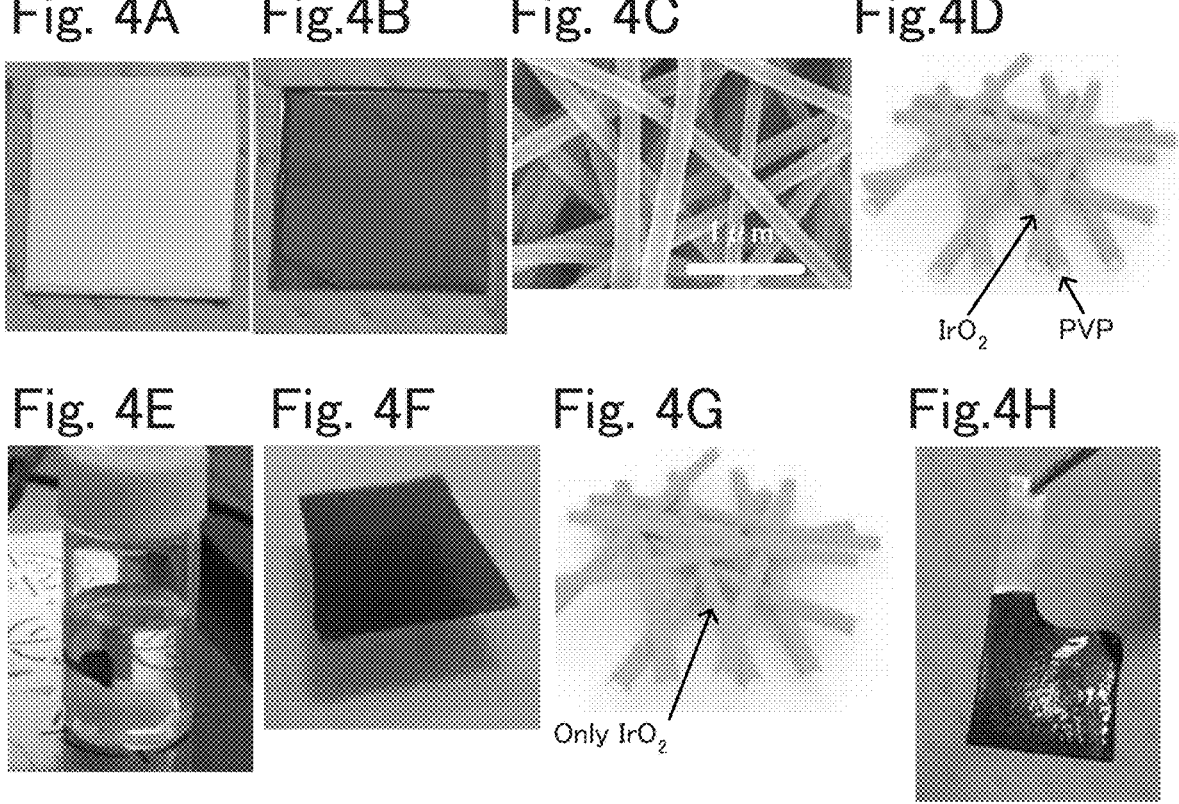
$IrO_2$    PVP
Fig. 4E    Fig. 4F    Fig. 4G    Fig.4H
Only $IrO_2$ Enlarged View
protrusions in which nanoparticles
having a diameter of 3 to 10 nm were
connected together A part fiber is exsisting Vapor deposition from this direction Layer IrO₂

Enlarged View

Pt

Au

Ag

Cu

Sn

Ru

Ir

STRUCTURE BODY, DEVICE, AND METHOD FOR MANUFACTURING STRUCTURE BODY

BACKGROUND OF THE INVENTION

1. Field of the Invention

The present specification discloses a structure body, a device, and a method for manufacturing a structure body.

2. Description of the Related Art

Examples of structure bodies disclosed in the related art include a material including an alumina porous body having an inner wall coated with Au nanoparticles (see Non-Patent Literature 1, for example), a material including graphene that has been shape-controlled to be a porous body (see Non-Patent Literature 2, for example), and a material including a free-standing structure including at least one of a fibrous member and a shell, the at least one of the fibrous member and the shell including at least one of Ag and Cu and having a three-dimensionally continuous configuration (see Patent Literature 1, for example). For example, these structure bodies can be used for absorbing visible light and converting the visible light into heat and for evaporating a liquid with the converted heat.

CITATION LIST

Patent Literature

PTL 1: WO 2019/049996

Non Patent Literature

Citation 1: Zhou L, et al. Self-assembly of highly efficient, broadband plasmonic absorbers for solar steam generation. Science Advances2, e1501227 (2016)
Citation 2: Ren H, et al. Hierarchical Graphene Foam for Efficient Omnidirectional Solar, Thermal Energy Conversion. Advanced Materials 29, 1702590 (2017)

SUMMARY OF THE INVENTION

Unfortunately, the structure bodies of Non-Patent Literature 1 and 2 had a relatively large thickness and weight, which was necessary for increasing an absorbance, and, therefore, in these structure bodies, it sometimes took a long time for heating due to light absorption to be accomplished. Furthermore, in the structure body of Patent Literature 1, heating due to light absorption was accomplished quickly compared with the structure bodies of Non-Patent Literature 1 and 2; however, further acceleration of heating due to light absorption has been desired.

The present disclosure has been made in view of the above-described problems, and a principal object of the present disclosure is to provide a structure body, a device, and a method for manufacturing a structure body in which heating due to light absorption can be accelerated.

The present inventors diligently performed studies to achieve the object described above and found that a structure body in which heating due to light absorption can be accelerated can be obtained as follows: a light-absorbing material and a dielectric material are formed on a surface of a nonwoven fabric or a porous membrane, which is used as a substrate, and thereafter, the substrate is removed. Accordingly, a structure body, a device, and a method for manufacturing a structure body of the present disclosure were completed.

Specifically, a structure body of the present disclosure includes a free-standing structure including at least one of a fibrous member or a shell. The at least one of a fibrous member or a shell is a layered body formed of at least one light-absorbing layer and at least one dielectric layer. The at least one light-absorbing layer includes a light-absorbing material that has an absorption in a visible light region, and the at least one dielectric layer includes a dielectric material. The at least one of a fibrous member or a shell has a three-dimensionally continuous configuration.

A device of the present disclosure includes the structure body described above. The structure body serves as a photothermal conversion material that absorbs visible light and converts the visible light into heat.

A method of the present disclosure for manufacturing a structure body includes a forming step and a removing step. The forming step includes forming a layered body on a surface of a substrate that includes a polymer, to form a free-standing structure including at least one of a fibrous member or a shell, the layered body being formed of at least one light-absorbing layer and at least, one dielectric layer, the at least one light-absorbing layer including a light-absorbing material that has an absorption in a visible light region, the at least one dielectric layer including a dielectric material, the at least one of a fibrous member or a shell being the layered body and having a three-dimensionally continuous configuration. The removing step includes removing all or a portion of the substrate.

The present disclosure can provide a structure body, a device, and a method for manufacturing a structure body in which heating due to light absorption can be further accelerated. Presumably, a reason for this is as follows. For example, in an instance where a metal is deposited on a surface of a substrate made of a polymer, by using physical vapor deposition, a large number of nuclei of metal nanoparticles are formed on the surface of the substrate, and the particles grow. As a result, a fibrous member and/or a shell constructed of aggregates of metal nanoparticles are formed on the surface of the substrate. Metal nanoparticles plasmonically absorb light and convert the light into heat. While the wavelength range of light that can be plasmonically absorbed by individual metal nanoparticles is narrow, a light-absorbing layer that is an aggregate of metal nanoparticles can plasmonically absorb light over a wide wavelength range. In addition, in an instance where a dielectric material is deposited on a surface of the light-absorbing layer by using physical vapor deposition to form a dielectric layer, a fibrous member and/or a shell made of a layered body formed of the light-absorbing layer and the dielectric layer are formed on the surface of the substrate. The dielectric layer enhances the plasmonic absorption that occurs in the light-absorbing layer. A structure body obtained by removing the substrate has an increased absorbance. This is because the structure body has a structure in which the fibrous member and/or the shell have a three-dimensionally continuous configuration, and light can be easily trapped in the three-dimensional structure. Furthermore, since the free-standing structure is maintained even after the substrate is removed, a high absorbance can be achieved even with a small amount of the structure body. Accordingly, it is believed that, with the present disclosure, heating due to light absorption can be further accelerated.

BRIEF DESCRIPTION OF THE DRAWINGS

FIGS. 3A to 3C present schematic illustrations of a method for manufacturing a structure body (nonwoven fabric structure) of the present disclosure.

FIGS. 4A to 4H present illustrations of a procedure for producing an IrO$_2$ nanowire nonwoven fabric (Reference Example 3).

DETAILED DESCRIPTION OF THE INVENTION

Figure 1:
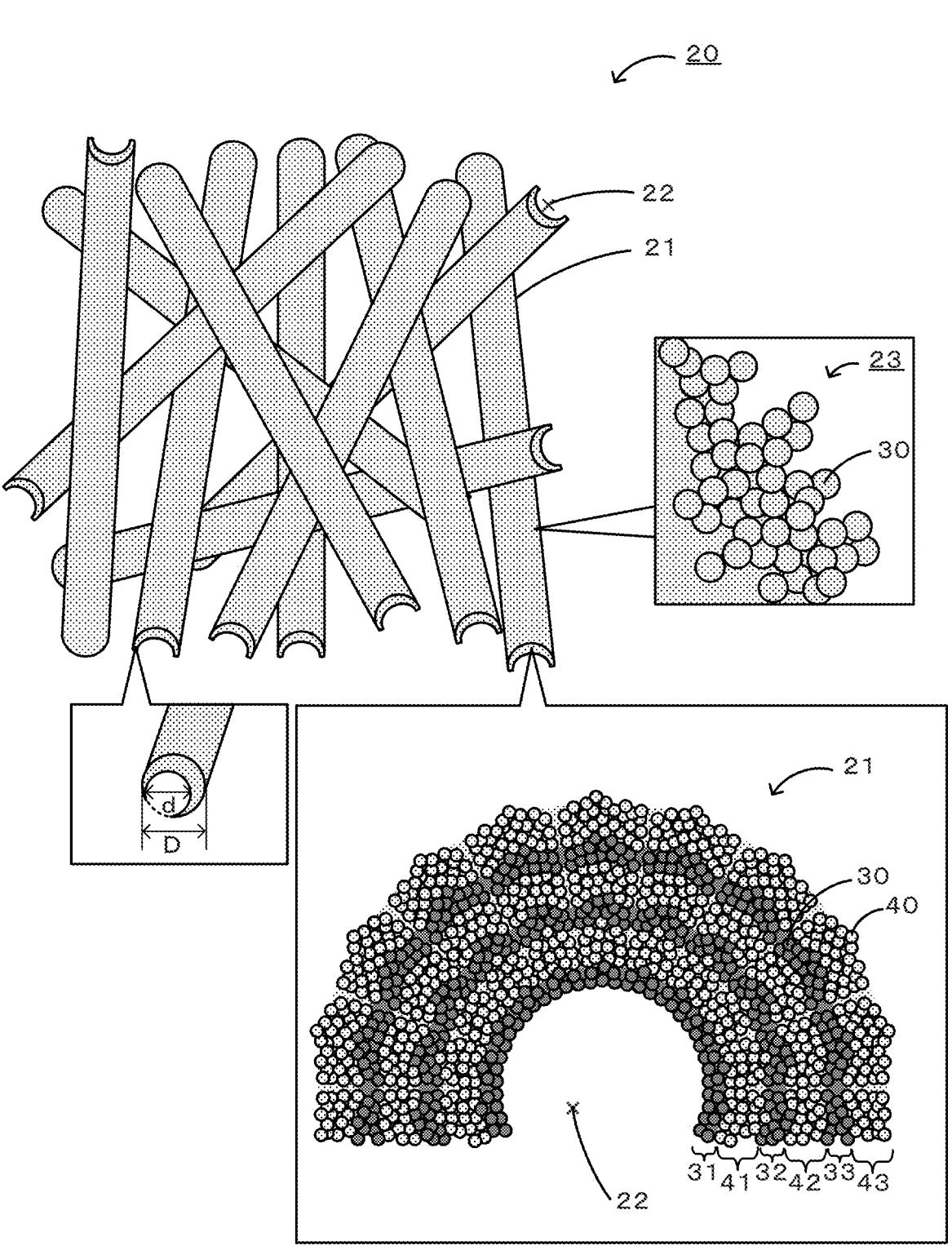
FIG. 1 is an exemplary illustration of a general configuration of a structure body 20.

Embodiments of the present disclosure will now be described in detail.

Structure Body

A structure body of the present disclosure includes a free-standing structure including a fibrous member and/or a shell. The fibrous member and/or the shell are each a layered body formed of at least one light-absorbing layer and at least one dielectric layer. The light-absorbing layer includes a light-absorbing material that has an absorption in a visible light region, and the dielectric layer includes a dielectric material. The fibrous member and/or the shell have a three-dimensionally continuous configuration. In the structure body, the fibrous member and/or the shell may be constructed of aggregates of nanoparticles. Furthermore, the structure body may be a nanostructured fabric having a free-standing structure in which the fibrous member and/or the shell are constructed of aggregates of nanoparticles and have a three-dimensionally continuous configuration. The structure body may be an inorganic structure body formed of an inorganic material. The structure body may serve as a light absorber that has an absorption in the visible light region or as a photothermal conversion material for converting absorbed light into heat.

The light-absorbing layer includes a light-absorbing material having an absorption in the visible light region (360 to 830 nm). The light-absorbing material may be metal nanoparticles. Metal nanoparticles plasmonically absorb light via surface placemen resonance. Examples of metals that may form the metal nanoparticles include noble metals, such as Au, Ag, Pt, Pd, Rh, Ir, Ru, and Os; main group metals, such as Sn, Al, Mg, Ti, V, and Zn; transition metals, such as Cu, Fe, Co, Ni, Mn, and Mo; and alloys of the foregoing metals. Examples of the alloys include Pt—Fe alloys, Pt—Ni alloys, Pt—Co alloys, Ir—Fe alloys, Ir—Co alloys, and Ir—Ni alloys. The light-absorbing layer may include metal nanoparticles containing one of these metals or may include metal nanoparticles containing two or more of these metals. The light-absorbing material may be nanoparticles containing at least one of Au, Ag, Cu, or Al or may be Ag nanoparticles, Nanoparticles containing any of these metals have a higher plasmonic absorption in the visible light region, and, therefore, such nanoparticles are preferable. The light-absorbing material may be metal nanoparticles having a particle diameter of 1 nm or greater and 100 nm or less, metal nanoparticles having a particle diameter of 1 nm or greater and 60 nm or less, or metal nanoparticles having a particle diameter of 1 nm or greater and 10 nm or less. Metal nanoparticles having a particle diameter of 1 nm or greater have a high plasmonic absorption, and metal nanoparticles having a particle diameter of 100 nm or less do not exhibit excessively high light scattering and, therefore, have a high plasmonic absorption. The metal nanoparticles may be crystalline or amorphous. The metal nanoparticles may be aggregated and be in the form of aggregates. For example, the light-absorbing layer may be constructed of aggregates of metal nanoparticles. The light-absorbing layer may be formed of one layer of metal nanoparticles or two or more layers of metal nanoparticles. The light-absorbing layer may have a protruding structure including the light-absorbing material, or a surface (or an interface along the dielectric layer) thereof. The protruding structure may have a diameter of 3 nm or greater and 10 nm or less. The protruding structure may be a protrusion having an external shape in the form of a conical or pyramidal solid, such as a pyramid or a cone. The diameter of the protruding structure is a maximum diameter of the protrusion (e.g., when the protrusion is a cone, the diameter of the bottom surface). Each of the one or more light-absorbing layers may have a thickness of 1 nm or greater and 100 nm or less, 1 nm or greater and 60 nm or less, or 1 nm or greater and 10 nm or less. The thickness of each of the one or more light-absorbing layers is determined as follows: a cross section of the layered body is examined for a predetermined number of fields of view (e.g., 5 fields of view) with an SEM, and an average of the values is determined.

The dielectric layer includes a dielectric material. The dielectric material enhances the plasmonic absorption due to the light-absorbing material. Examples of the dielectric material include metal oxides, such as iridium oxide, copper oxide, iron oxide, nickel oxide, manganese oxide, cobalt oxide, titanium oxide, and silicon oxide; metal sulfides, such as iridium sulfide, copper sulfide, iron sulfide, nickel sulfide, cobalt sulfide, and molybdenum sulfide; metal nitrides, such as copper nitride, iron nitride, nickel nitride, manganese nitride, and cobalt nitride; metal carbides, such as iridium carbide, silicon carbide, iron carbide, copper carbide, cobalt carbide, and manganese carbide; metal phosphides, such as iridium phosphide, iron phosphide, copper phosphide, cobalt phosphide, and manganese phosphide; and metal iodides, such as iridium iodide, iron iodide, copper iodide, cobalt iodide, and manganese iodide. Additionally or alternatively, the dielectric material may be, for example, a solid formed of a nonmetallic inorganic material, such as Si or Ge. The dielectric layer may include one of these dielectric materials or two or more of these dielectric materials. The dielectric material may be at least one of $Cu_2O$, $TiO_2$, $Fe_2O_3$, $SiO_2$, Si, or Ge or may be $Cu_2O$. It is preferable that the dielectric material have a high refractive index. This is because, in such a case, the electrons in the light-absorbing layer can easily move, which results in a high plasmonic absorption. Preferably, the dielectric material is a material having an absolute refractive index for light having a wavelength of 589.3 nm of greater than or equal to 1, for example. The absolute refractive index is more preferably greater than or equal to 1.5 and even more preferably greater than or equal to 2. The refractive index of the dielectric material may be less than or equal to 6, less than or equal to 3, or less than or equal to 2. The dielectric material may be dielectric nanoparticles. The dielectric material may be dielectric nanoparticles having a particle diameter of 1 nm or greater and 100 nm or less, dielectric nanoparticles having a particle diameter of 5 nm or greater and 70 nm or less, or dielectric nanoparticles having a particle diameter of 5 nm or greater and 10 nm or less. The dielectric nanoparticles may be crystalline or amorphous. The dielectric nanoparticles may be aggregated and be in the form of aggregates. For example, the dielectric layer may be constructed of aggregates of dielectric nanoparticles. The dielectric layer may be formed of one layer of dielectric nanoparticles or two or more layers of dielectric nanoparticles. The dielectric layer may have a protruding structure including the dielectric material on a surface (or an interface along the light-absorbing layer) thereof. The protruding structure may have a diameter of 3 nm or greater and 10 nm or less. The protruding structure may be a protrusion having an external shape in the form of a conical or pyramidal solid, such as a pyramid or a cone. The diameter of the protruding structure is a maximum diameter of the protrusion (e.g., when the protrusion is a cone, the diameter of the bottom surface). Each of the one or more dielectric layers may have a thickness of 3 nm or greater and 100 nm or less, 5 nm or greater and 70 nm or less, or a nm or greater and 25 nm or less. When the thickness of the dielectric layer is greater than or equal to 3 nm, the effect of enhancing the plasmonic absorption is at a high level, and when the thickness of the dielectric layer is less than or equal to 100 nm, the dielectric material is present in an amount that is not excessive, which results in good photothermal conversion efficiency. The thickness of each of the one or more dielectric layers is determined as follows: a cross section of the layered body is examined for a predetermined number of fields of view (e.g., 5 fields of view) with an SEM, and an average of the values is determined.

In the layered body, the number of light-absorbing layers and the number of dielectric layers may each be one, or at least one of the light-absorbing layer or the dielectric layer may be a plurality of the layers. The number of light-absorbing layers may be equal to or different from the number of dielectric layers. It is preferable that the layered body include light-absorbing layers and dielectric layers that are alternately disposed, the light-absorbing layers be two or more and four or fewer layers identical to the light-absorbing layer, and the dielectric layers be two or more and four or fewer layers identical to the dielectric layer. It is more preferable that the layered body include light-absorbing layers and dielectric layers that are alternately disposed, the light-absorbing layers be three layers identical to the light-absorbing layer, and the dielectric layers be three layers identical to the dielectric layer. In the instance where the structure body includes the layered body that includes two or more and four or fewer light-absorbing layers and two or more and four or fewer dielectric layers that are alternately disposed, heating due to light absorption can be further accelerated. The layered body may include multi-layer structures each formed of the light-absorbing layer and the dielectric layer. The multi-layered body may be two or more and four or fewer multi-layer structures or may be three multi-layer structures. In the layered body, a total thickness of the one or more light-absorbing layers (in the instance where the light-absorbing layer is a single layer, greater and 20 nm or less. Furthermore, in the layered body, a total thickness of the one or more dielectric layers (in the instance where the dielectric layer is a single layer, the thickness of the layer) may be 5 nm or greater and 200 nm or less, 10 nm or greater and 100 nm or less, or 15 nm or greater and 70 nm or less. The layered body may have a thickness of 7 nm or greater and 300 nm or less, 13 nm or greater and 150 nm or less, or 20 nm or greater and 30 nm or less, for example.

The layered body is formed as the fibrous member and/or the shell. The term "fibrous member" refers to a material in which, for example, a dimension in a direction perpendicular to a lengthwise direction of the fibrous member is less than (e.g., one-half or less or one-fifth or less of) a dimension in the lengthwise direction of the fibrous member. In instances where the layered body is formed as the fibrous member, it is preferable that the light-absorbing layer and the dielectric layer be layered in the direction perpendicular to the lengthwise direction of the fibrous member. The fibrous member may be a tubular nanowire or a semi-tubular nanowire, which has an open portion in the tube surface. For example, the fibrous member may be formed on a surface of a fiber, which is used as a substrate, and may have a shape based on the fiber. The fibrous member may have a thickness of less than or equal to 1 μm, which may be suitable from the standpoint of the formation of the nanoparticles and the realization of the protruding structure formed of nanoparticles. The term "shell" refers to a material in which, for example, a dimension in a direction perpendicular to a thickness direction of the shell is greater than (e.g., twice or more or five times or more) a dimension in the thickness direction of the shell. In instances where the layered body is formed as the shell, it is preferable that the light-absorbing layer and the dielectric layer be layered in the thickness direction of the shell. The shell may have a curved surface with a radius of curvature of less than or equal to 1 μm, which may be suitable from the standpoint of the formation of the nanoparticles and the realization of the protruding structure formed of nanoparticles.

The structure body of the present disclosure may be produced by forming the layered body on a surface of a substrate that includes a polymer. For example, the structure body may be produced by forming the layered body on a surface of a substrate made of a polymer, by using physical vapor deposition. In this structure body, the fibrous member and/or the shell are formed to follow a surface shape of the substrate. When the surface of the substrate is microscopically flat, the fibrous member and/or the shell also become microscopically flat. In general, however, surfaces of a substrate have microscopic or macroscopic irregularities, and in addition, during physical vapor deposition, some atoms or molecules travel to the opposite side of the substrate. As a result, the fibrous member and/or the shell have microscopically or microscopically curved portions.

The structure body of the present disclosure has a free-standing structure including a fibrous member and/or a shell, and the fibrous member and/or the shell have a three-dimensionally continuous configuration. The term "free-standing structure" refers to a structure that is sufficiently strong to be handled. The phrase "the fibrous member and/or the shell having a three-dimensionally continuous configuration" means that a dimension in a thickness direction of the structure body has a finite value and does not necessarily mean that the structure body is a joined body in which a plurality of fibrous members and/or shells are joined together. That is, the following cases are possible. The structure body may be made of a single fibrous member or a single shell. The structure body may be a joined body in which a plurality of fibrous members and/or shells are joined together three-dimensionally. Configurations for the structure body include the following: a configuration in which a microscopically flat surface (surface having an infinite radius of curvature) is present; and a configuration in which a curved surface is present.

In instances where the structure body of the present disclosure is produced by forming the layered body on a surface of a substrate that includes a polymer, and the surface of the substrate is microscopically and macroscopically formed of a single surface, the structure body may be formed of a single shell. On the other hand, in instances where the surface of the substrate is formed of an assembly of a plurality of curved surfaces, such as in the instance of a nanowire nonwoven fabric, the structure body is typically formed of an assembly of a plurality of fibrous members having a curve-shaped surface.

The structure body of the present disclosure may further include a support portion made of a polymer, and the support portion may support at least a portion of the free-standing structure (the fibrous member and/or the shell). In the structure body of the present disclosure, after the layered body is formed on a surface of a substrate made of a polymer, the substrate, typically, is completely removed. Alternatively, a portion of the polymer for partially supporting the fibrous member and/or the shell may be retained. However, if an excessive amount of the polymer is retained, photothermal conversion efficiency may be reduced. In terms of achieving a high photothermal conversion efficiency, it is preferable that a polymer retention ratio be less than or equal to 20 mass %. The retention ratio is preferably less than or equal to 10 mass % and more preferably less than or equal to 5 mass %. As referred to herein, the term "polymer retention ratio" refers to the value determined by equation (1), shown below. In the equation, $W_0$ is the mass per unit area of the structure body immediately after physical vapor deposition; W is the mass per unit area of the structure body after the polymer used as the template has been removed by using a solvent that is capable of dissolving the polymer; and $W_m$ is the mass per unit area of the deposition material that forms the structure body. Note that $W_m$ can be estimated from an amount of the physical vapor deposition.

$$\text{Polymer retention ratio}=(W-W_m)\times100/(W_0-W_m) \qquad (1)$$

The structure body of the present disclosure takes any of a variety of forms, depending on a structure of the substrate used. For example, in an instance where a nanowire nonwoven fabric is used as the substrate, and the layered body is formed on one side of the nonwoven fabric by using physical vapor deposition, the resulting free-standing structure is a nonwoven fabric structure (nanostructured fabric) including fibrous members made of semi-tubular nanowires, with the fibrous members constituting a three-dimensionally continuous configuration. On the other hand, in an instance where a nanowire nonwoven fabric is used as the substrate, and the layered body is formed on both sides of the nonwoven fabric by using physical vapor deposition, the resulting free-standing structure is a nonwoven fabric structure including fibrous members made of tubular nanowires, with the fibrous members constituting a three-dimensionally continuous configuration. The term "nonwoven fabric structure" refers to a structure that results when the substrate is a nonwoven fabric and which has a shape that follows the structure of the nonwoven fabric used as the substrate.

In an instance where a polymeric porous membrane having pores is used as the substrate, and the layered body is formed on a surface of the substrate by using physical vapor deposition, the resulting free-standing structure is a porous membrane structure formed of a shell having pores, with the shell having a three-dimensionally continuous configuration. The term "porous membrane structure" refers to a free-standing structure that results when the substrate is a porous membrane and which has a shape that follows the structure of the porous membrane used as the substrate. In the free-standing structure, the pores may have a radius of curvature of 20 nm or greater and 200 nm or less.

In the structure body, the free-standing structure may have flexibility. For example, in instances where the layered body is formed on one side of a nanowire nonwoven fabric by using physical vapor deposition, the resulting free-standing structure can have flexibility and, therefore, can be handled easily.

The structure body may have a sheet shape, such as a shape of a nonwoven fabric structure. The structure body may have a weight per cm$^2$ of 1 µg or greater and 500 µg or less, 10 µg or greater and 100 µg or less, or 15 µg or greater and 60 µg or less. Even with such a weight on the order of micrograms, the structure body is capable of strongly absorbing light over the entire visible light region and, therefore, enables a high photothermal conversion efficiency to be achieved even when an amount (weight) of usage of the structure body is small. Accordingly, heating due to light absorption can be accomplished quickly.

FIG. 1 is an exemplary illustration of a general configuration of a structure body 20. The structure body 20 has a free-standing structure including fibrous members 21, and the fibrous members 21 constitute a three-dimensionally continuous configuration. The fibrous members 21 have substrate spaces 22, which are formed as a result of the removal of the substrate fibers. The fibrous members 21 are formed of a layered body that includes a first light-absorbing layer 31, a first dielectric layer 41, a second light-absorbing layer 32, a second dielectric layer 42, a third light-absorbing layer 33, and a third dielectric layer 43, which are layered in this order, starting from the substrate space 22-side. The light-absorbing layers 31, 32, and 33 are constructed of aggregates of metal nanoparticles 30. When surfaces of the light-absorbing layers 31, 32, and 33 opposite to the substrate space 22 (interfaces along the dielectric layers 41, 42, and 43) are seen in a magnified view, it can be observed that protruding structures having a diameter of 3 nm or greater and 10 nm or less have been formed. The dielectric layers 41, 42, and 43 are constructed of aggregates of dielectric nanoparticles 40. When surfaces of the dielectric layers 41, 42, and 43 opposite to the substrate space 22 (interfaces along the light-absorbing layers 32 and 33 and a surface of the fibrous member 21) are seen in a magnified view, it can be observed that protruding structures having a diameter of 3 nm or greater and 10 nm or less have been formed. In FIG. 1 the metal nanoparticles 30 are illustrated as dark-shaded areas, and the dielectric particles 40 as light-shaded areas. Furthermore, in FIG. 1, the protruding structures on the surface of the fibrous members 21 are an example of the protruding structure and illustrated as protruding structures 23. With the above-described structure, the structure body 20 is capable of strongly absorbing light over the entire visible light region and, therefore, enables a high photothermal conversion efficiency to be achieved even when the amount of usage of the structure body 20 is small. Accordingly, heating due to light absorption can be accomplished quickly. Furthermore, the structure body 20 has flexibility and, therefore, can be handled easily. In addition, the structure body 20 has a large surface area, which enhances a nanoparticle utilisation ratio.

An average diameter of the fibrous members 21 is preferably greater than or equal to 10 nm and more preferably greater than or equal to 50 nm or may be greater than or equal to 100 nm, for example. The average diameter of the fibrous members 21 is preferably less than or equal to 800 nm and more preferably less than or equal to 600 nm or may be less than or equal to 500 nm, for example. In this instance, a diameter of the substrate spaces 22 (see a diameter d in FIG. 1), that is, an average diameter of the substrate fibers, is preferably greater than or equal to 5 nm and more preferably greater than or equal to 40 nm or may be greater than or equal to 80 nm, for example. The average diameter of the substrate spaces 22 is preferably less than or equal to 780 nm and more preferably less than or equal to 580 nm or may be less than or equal to 480 nm, for example. The average diameter of the substrate fibers is a major factor in determining the average diameter of the fibrous members 21. Smaller average diameters of the substrate fibers result in larger surface areas of the structure body 20. Note that in instances where the fibrous member has a shape in which a portion is missing, such as a crescent shape, as viewed in cross section, the diameter of the fibrous member is the diameter of an imaginary circle that has a circular shape including the missing portion (see a diameter D in FIG. 1). The average diameter is to be determined by performing an examination with an SEM for a predetermined number of fields of view (e.g., five fields of view), determining the diameter of individual fibers, and obtaining an average of the diameters.

Device

A device of the present disclosure is a device that uses the above-described structure body as a photothermal conversion material. Examples of the device include photothermal conversion apparatuses that use the structure body as a photothermal conversion member that absorbs light and converts the light into heat.

Figure 2:
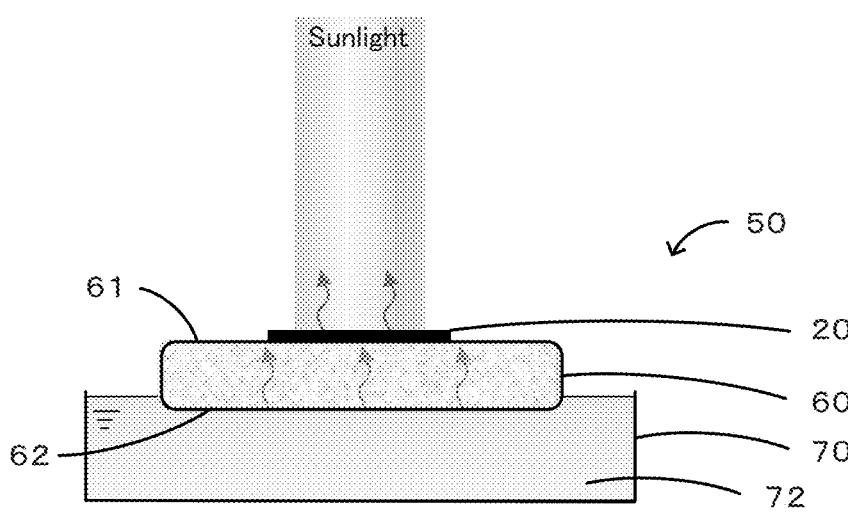
FIG. 2 is an exemplary illustration of a general configuration of a liquid evaporator 50.

Furthermore, the device of the present disclosure may be a liquid evaporator including such a photothermal conversion apparatus. FIG. 2 is an exemplary illustration of a general configuration of a liquid evaporator 50. The liquid evaporator 50 may include the structure body 20, a support body 60, and a container 70. The structure body 20 is a photothermal conversion material that absorbs light and converts the light into heat. The support body 60 is a component having a liquid absorbing property and a thermal insulation property. A first surface 61 of the support body 60 is in contact with the structure body 20, and a second surface 62 of the support body 60 is to be in contact with a liquid 72 when the liquid 72 is stored in the container 70. It is preferable that the support body 60 be a component that can float on the liquid 72. Examples of the support body 60 include wood bodies and styrofoam bodies. The liquid evaporator 50 evaporates the liquid 72 by using heat converted by the structure body 20. The liquid 72 may be water or an organic solvent or may be a liquid containing impurities, such as a salt. The liquid evaporator 50 may include a condenser for condensing evaporated liquid. Such a device can distill liquid. For example, the device may be a purifier that purifies water by distilling salt water or contaminated water. Documents regarding liquid evaporators include Sci. Adv. 3 Apr. 2016, Vol. 2, No. 4, e1501227, Nature Communications volume 5, Article number: 4449 (2014), Adv. Energy Materials, Vol. 8, Issue 4, Feb. 5, 2018, 1701028, and Nature Photonics volume 10, pages 393-393 (2016). In the device of the present disclosure, since the structure body used is a nanostructured fabric or the like, heating due to light absorption can be further accelerated, which results in a high photothermal conversion efficiency, and the device can be handled easily, which are preferable. Furthermore, using the device of the present disclosure as a liquid evaporator is preferable because such a liquid evaporator can evaporate liquid quickly.

Method for Manufacturing Structure Body

A method of the present disclosure for manufacturing a structure body includes a forming step and a removing seep. The forming step includes forming a free-standing structure on a surface of a substrate that includes a polymer. The free-standing structure includes a fibrous member and/or a shell. The fibrous member and/or the shell are each a layered body formed of at least one light-absorbing layer and at least one dielectric layer. The light-absorbing layer includes a light-absorbing material that has an absorption in a visible light region, and the dielectric layer includes a dielectric material. The fibrous member and/or the shell have a three-dimensionally continuous configuration. The description of the free-standing structure provided in the "Structure Body" section also applies to the free-standing structure mentioned here, which includes the fibrous member and/or the shell that have a three-dimensionally continuous configuration, with the fibrous member and/or the shell being a layered body formed of the light-absorbing layer and the dielectric layer. Accordingly, redundant descriptions may be emitted.

Forming Step

In this step, the layered body formed of the light-absorbing layer and the dielectric layer is formed on a surface of a substrate that includes a polymer, and, accordingly, the free-standing structure including a fibrous member and/or a shell that have a three-dimensionally continuous configuration, with the fibrous member and/or the shell being the layered body, is formed on the surface of the substrate. In this step, regarding the formation of the layered body on a surface of a substrate, the light-absorbing layer may be formed first, or the dielectric layer may be formed first; however, it is preferable that the light-absorbing layer be formed first. In this step, the layered body may be formed by using physical vapor deposition.

A polymer is used in the substrate. In the instance where a polymer is used as the substrate, the nucleation and growth of the nanoparticles proceed relatively easily on a surface of the substrate during the formation of the fibrous member and/or the shell. A composition of the polymer used in the substrate is not particularly limited. However, in terms of facilitating the removal of the substrate, it is preferable that the substrate be a solvent-soluble polymer. Examples of the solvent-soluble polymer include polyethersulfones (PES), polyvinylidene fluorides (PVDF), polyvinyl pyrrolidones (PVP), polyethylenes (PE), polypropylenes (PP), polyesters, polyvinyl alcohols (PVA), polyacrylonitriles (PAN), polyethylene oxides (PEG), polyacrylates, and polypropylene oxides.

The substrate may have a structure that is not particularly limited, and the structure may be an optimal structure selected in accordance with a purpose. The structure body obtained by using the method of the present disclosure for manufacturing a structure body has a structure having a surface shape transferred from a surface shape of the substrate. Accordingly, by using a polymer having a nano-sized structure for the substrate, a free-standing film having a nano-sized structure can be manufactured. The substrate may fee a nonwoven fabric or a porous membrane, examples of which are listed below.

(a) Nanowire nonwoven fabrics produced by electrospinning or the like (b) Porous membranes having pores that have a radius of curvature of 20 nm or greater and 200 nm or less (so-called "membrane filters")

(c) Porous membranes made of polystyrene particles or the like and having an opal structure The polymer nonwoven fabric (substrate nonwoven fabric) to be used as the substrate can be produced by using electrospinning. A fiber diameter of the substrate nonwoven fabric may be, for example, in the range of the diameter of the substrate spaces described above. The fiber diameter of the substrate nonwoven fabric can be adjusted fey adjusting the polymer concentration of the solution that is used for the electrospinning, an electric field therefor, a feed rate for the solution, and/or the like, for example.

In this step, the method to be used to form the layered body is not particularly limited and may be physical vapor deposition. Examples of methods for the physical vapor deposition include sputtering methods and pulse laser deposition (PLD) methods. In the instance where the layered body is formed on a surface of a substrate by using physical vapor deposition, the physical vapor deposition may be performed on one side of the substrate or on both sides of the substrate. For example, in the instance where a polymer nanowire nonwoven fabric is used as the substrate, it is possible, by performing physical vapor deposition only on one side of the nanowire nonwoven fabric, to obtain a nonwoven fabric structure made of a layered body having a semi-tubular nanowire shape. Semi-tubular nanowires have a higher specific surface area than tubular nanowires or rod-shaped nanowires. Accordingly, in instances where such a nonwoven fabric structure is used, for example, in a photothermal conversion material of a photothermal conversion device, a high photothermal conversion efficiency can be achieved. The conditions for the physical vapor deposition are not particularly limited and may be optimal conditions selected in accordance with a purpose. In general, the longer the deposition time, the larger the thickness of the deposition layer. Furthermore, in physical vapor deposition methods, an amount of the deposition can be controlled at an atomic level. Accordingly, by optimizing the vapor deposition conditions, it is also possible to form protruding structures having a diameter of 3 nm or greater and 10 nm or less on a surface of the deposition layer.

Regarding the formation of the light-absorbing layer, which forms the layered body, a material of the light-absorbing layer may be, for example, at least one of the materials mentioned above as examples of the metal that forms the metal nanoparticles, namely, noble metals, main group metals, transition metals, and alloys thereof. The material of the light-absorbing layer may be at least one of Au, Ag, Cu, or Al. In this case, a light-absorbing layer can be formed that includes, as the light-absorbing material, nanoparticles containing at least one of Au, Ag, Cu, or Al. It is preferable that the formation of the light-absorbing layer be carried out in an inert atmosphere, such as an Ar atmosphere.

Regarding the formation of the dielectric layer, which forms the layered body, a material of the dielectric layer may be, for example, at least one of the materials mentioned above as examples of the dielectric material, namely, metal compounds, such as metal oxides, metal sulfides, metal nitrides, metal carbides, metal phosphides, and metal iodides, and nonmetallic inorganic materials; or the material of the dielectric layer may be the metal in any of these metal compounds. The formation of the dielectric layer may be carried out in an inert atmosphere, such as an Ar atmosphere, or may be carried out in an atmosphere that contains an element, in instances in which, for example, a metal compound that serves as the dielectric material is formed by using a metal. The element corresponds to the type of the metal compound, and examples of the element include oxygen, sulfur, nitrogen, carbon, phosphorus, and iodine. Furthermore, in instances where, for example, a metal compound that serves as the dielectric material is formed by using a metal, it is possible to form the metal compound in the following manner: after the metal is formed, the metal is treated in an atmosphere that contains an element and allowed to react with the element. The element corresponds to the type of the metal compound, and examples of the element include oxygen, sulfur, nitrogen, carbon, phosphorus, and iodine. The material of the dielectric layer may include at least one of Cu, Ti, Fe, Si, or Ge. In this case, a dielectric layer can be formed that includes, as the dielectric material, at least one of $Cu_2O$, $TiO_2$, $Fe_2O_3$, $SiO_2$, Si, or Ge.

In this step, one light-absorbing layer and one dielectric layer may be formed, or at least one of the light-absorbing layer or the dielectric layer may be formed as a plurality of the layers. The number of light-absorbing layers may be equal to or different from the number of dielectric layers. In this step, it is preferable that light-absorbing layers and dielectric layers be alternately formed, the light-absorbing layers being two or more and four or fewer layers identical to the light-absorbing layer, the dielectric layers being two or more and four or fewer layers identical to the dielectric layer; it is more preferable that light-absorbing layers and dielectric layers be alternately formed, the light-absorbing layers being three layers identical to the light-absorbing layer, the dielectric layers being three layers identical to the dielectric layer. In this step, multi-layer structures each formed of the light-absorbing layer and the dielectric layer may be formed. In this step, two or more and four or few multi layer structures or three multi-layer structure may be formed.

Removing Step

In this step, a process for removing all or a portion of the substrate is performed after the fibrous member and/or the shell, which are each the layered body, are formed on the surface of the substrate. All of the substrate may be removed, or a portion of the substrate may be removed. In terms of enhancing the photothermal conversion efficiency, it is preferable that all of the substrate be removed. The method to be used to remove the substrate is not particularly limited and may be an optimal method selected in accordance with the type of the substrate. For example, in instances where a solvent-soluble polymer is used as the substrate, it is preferable that the substrate be removed by using a solvent.

Examples of solvents that can dissolve a variety of polymers include dimethylformamide (DMF), N-methyl-2-pyrrolidone (NMP), solutions of NaBH$_4$ (solvent: a 1:1 mixture of water and ethanol), chloroform, acetone, alcohols, such as methanol and ethanol, water, 2-methyltetrahydrofuran, dioxane, dimethyl sulfoxide, sulfolane, and nitromethane.

FIGS. 3A to 3C present schematic illustrations of a method for manufacturing a structure body (nonwoven fabric structure) of the present disclosure. FIG. 3A is a schematic illustration of a nonwoven fabric made of PVP nanowires having a diameter of 100 to 200 nm. In an instance where such a nonwoven fabric is used as the substrate, and a material for the light-absorbing layer and a material for the dielectric layer, which are materials for the layered body, are deposited on a surface of the substrate by using physical vapor deposition, a composite body can be obtained in which a shell made of the layered body has been formed on the surface of the substrate, as illustrated in FIG. 3B. Further, by removing the PVP nanowires from the obtained composite body, a nonwoven fabric (pure nonwoven fabric made of the layered body nanowires) can be obtained in which the nanowires are made of substantially only the layered body, and the nanowires constitute a three-dimensionally continuous configuration, as illustrated in FIG. 3C. In this instance, by optimizing the conditions for the physical vapor deposition, several nanoscale protrusions can be formed on surfaces of the light-absorbing layers and surfaces of the dielectric layers.

When the material for the light-absorbing layer and the material for the dielectric layer, which are materials for the layered body, are deposited on a surface of a substrate made of a polymer, by using physical vapor deposition, a large number of nuclei of nanoparticles are formed on the surface of the substrate, and the particles grow. As a result, a fibrous member and/or a shell constructed of aggregates of nanoparticles are formed on the surface of the substrate. When the physical vapor deposition is further continued, further nucleation and growth of nanoparticles occur repeatedly on the surface of the fibrous member and/or the shell. As a result, protruding structures constructed of nanoparticles are formed on the surfaces of the light-absorbing layers and surfaces of the dielectric layers. The resulting fibrous member and/or shell have a three-dimensionally continuous configuration, and therefore, even after the substrate is removed, the free-standing structure is maintained.

In the above-described structure body, device, and method for manufacturing a structure body of the present disclosure, heating due to light absorption can be further accelerated. Presumably, a reason for this is as follows. For example, in an instance where a metal is deposited on a surface of a substrate made of a polymer, by using physical vapor deposition, a large number of nuclei of metal nanoparticles are formed on the surface of the substrate, and the particles grow. As a result, a fibrous member and/or a shell constructed of aggregates of metal nanoparticles are formed on the surface of the substrate. Metal nanoparticles plasmonically absorb light and convert the light into heat. While the wavelength range of light that can be plasmonically absorbed by individual metal nanoparticles is narrow, a light-absorbing layer that is an aggregate of metal nanoparticles can plasmonically absorb light over a wide wavelength range. In addition, in an instance where a dielectric material is deposited on a surface of the light-absorbing layer by using physical vapor deposition to form a dielectric layer, a fibrous member and/or a shell made of a layered body formed of the light-absorbing layer and the dielectric layer are formed on the surface of the substrate. The dielectric layer enhances the plasmonic absorption that occurs in the light-absorbing layer. A structure body obtained by removing the substrate has an increased absorbance. This is because the structure body has a structure in which the fibrous member and/or the shell have a three-dimensionally continuous configuration, and light can be easily trapped in the three-dimensional structure. Furthermore, since the free-standing structure is maintained even after the substrate is removed, a high absorbance can be achieved even with a small amount of the structure body. Accordingly, it is believed that, with the present disclosure, heating due to light absorption can be further accelerated.

It will be understood that the present disclosure is in no way limited to the embodiments described above and may be practiced in a variety of forms within the technical scope of the present disclosure.

EXAMPLES

Examples are described below, which are examples in which structure bodies having a free-standing structure were produced specifically.

Reference Examples 1 and 2

A 4×4 cm piece of a PES membrane filter (trade name: Millipore PES) was cut, and a Pt film was formed on a surface of the membrane filter by using a sputtering method (forming step). The sputtering was performed in an Ar atmosphere by using an MC 1000 ion sputtering system, manufactured by Hitachi High-Technologies Corporation. Next, PES was removed by using DMF and NMP (removing step) to obtain a structure body having a free-standing structure made of only Pt. This was designated as Reference Example 1. Furthermore, another structure body having a free-standing structure made of only Pt was obtained in a manner similar to that for Reference Example 1 except that a PVDF membrane filter was used as the substrate. This was designated as Reference Example 2.

Reference Example 3

FIGS. 4A to 4K present illustrations of a procedure for producing an IrO$_2$ nanowire nonwoven fabric (Reference Example 3). First, an 8 mass % solution of PVP in methanol was subjected to electrospinning at 1 kV/cm. Thus, a nonwoven fabric made of PVP polymer nanowires having a diameter of 100 to 200 nm was prepared. FIG. 4A is a photograph of the prepared PVP nanowire nonwoven fabric. Next, an IrO$_2$ film was formed on a surface of the PVP nanowire nonwoven fabric by using a sputtering method. The IrO$_2$ film was formed by sputtering Ir in a 5% oxygen-95% argon atmosphere. FIG. 4B is a photograph of the PVP nanowire nonwoven fabric sputtered with IrO$_2$, FIG. 4C and FIG. 4D are, respectively, an SEM photograph and a schematic illustration of the PVP nanowires including the formed IrO$_2$ film.

Next, the obtained nonwoven fabric was placed in a 0.5 M solution of NaBH$_4$ (solvent: a 1:1 mixture of water and ethanol) and was stirred at 80° C. for 30 minutes, thereby removing PVP. Thus, an IrO$_2$ nanowire nonwoven fabric was obtained. FIG. 4E is a photograph of the process of stirring, which was performed as a PVP removal treatment. FIG. 4F is a photograph showing a state of the IrO$_2$ nanowire nonwoven fabric after the PVP removal treatment, with the IrO$_2$ nanowire nonwoven fabric being floated in an aqueous solution. FIG. 4G is a schematic illustration of the IrO$_2$ nanowire after the PVP removal treatment. After the PVP removal treatment, the $IrO_2$ nanowire nonwoven fabric was scooped up with a Ti plate from the surface of the aqueous solution. FIG. 4H is a photograph of an $IrO_2$—Ti plate obtained in this manner.

Reference Example 4

A 4 mass % solution of PVP in methanol was subjected to electrospinning at 1 kV/cm. Thus, a nonwoven fabric made of PVP polymer nanowires having a diameter of 10 to 20 nm was prepared. Thereafter, in a manner similar to that for Reference Example 3 except that the PVP nanowire nonwoven fabric was used as the substrate, an $IrO_2$ nanowire nonwoven fabric was obtained. This was designated as Reference Example 4.

Evaluation of Reference Examples 1 to 4

Figures 5A, 5B, 5C, 5D, 5E, 5F:
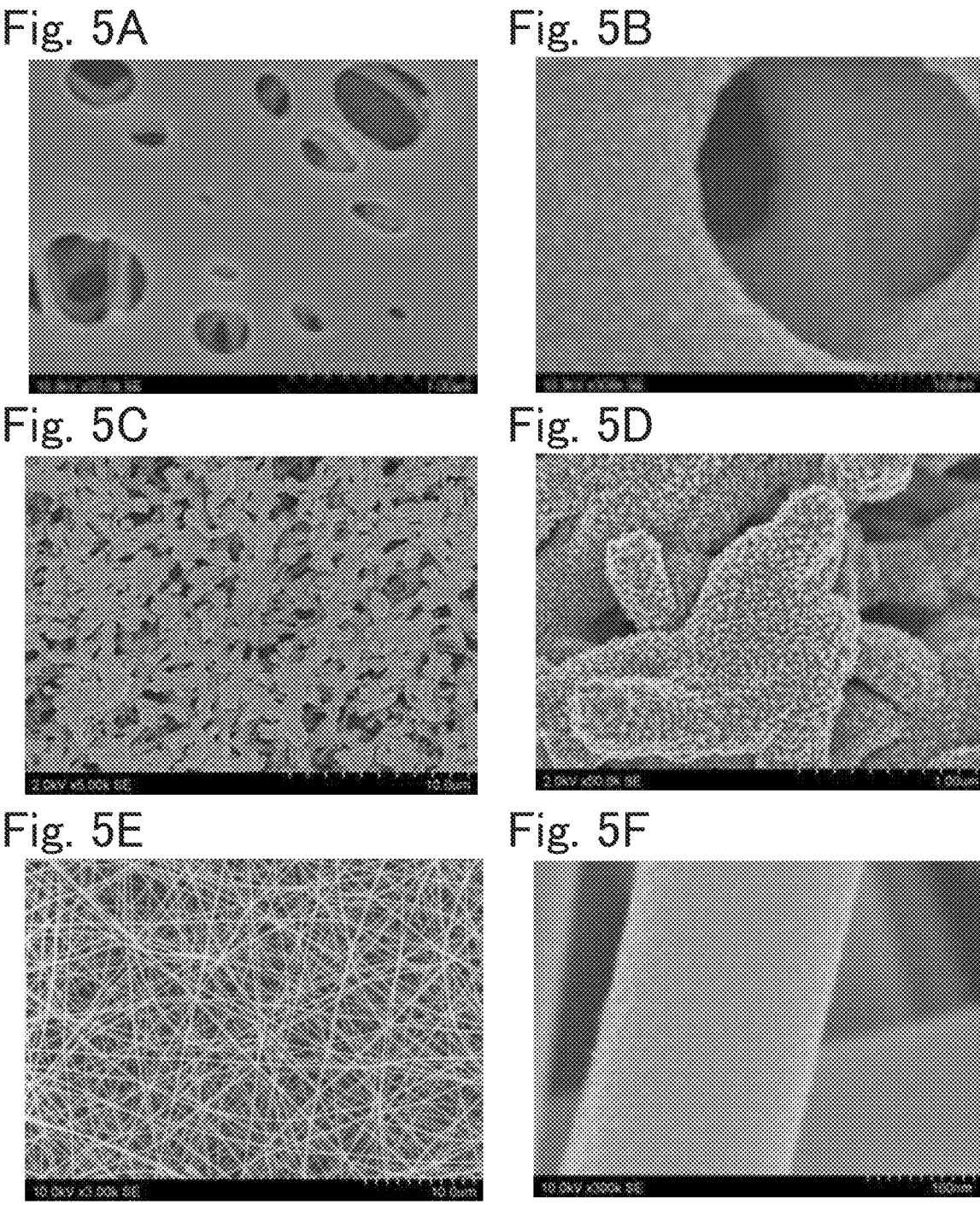
FIGS. 5A to 5F show the results of examinations of Reference Examples 1 to 3.

Microstructures of the produced structure bodies of Reference Examples 1 to 4 were examined with a scanning electron microscope (an FE 5500 SEM, manufactured by Hitachi High-Technologies Corporation). FIGS. 5A to 5F show the results of the examination of Reference Examples 1 to 3. FIG. 5A is a low-magnification SEM image of Reference Example 1, and FIG. 5B is a high-magnification SEM image of Reference Example 1. Furthermore, FIG. 5C is a low-magnification SEM image of Reference Example 2, and FIG. 5D is a high-magnification SEM image of Reference Example 2. Furthermore, FIG. 5E is a low-magnification SEM image of Reference Example 3, and FIG. 5F is a high-magnification SEM image of Reference Example 3. From FIG. 5A to FIG. 5D, the following findings were made. The production method described above enabled the production of flexible structure bodies having a free-standing structure made of Ft, with the structure bodies having a pore structure transferred entirely from a pore structure of the membrane filter made of a polymer. It was found that the structure bodies were constructed of aggregates of Pt nanoparticles having a diameter of 3 to 10 nm. Furthermore, as shown in FIG. 5E and FIG. 5F, it was found that the production method described above enabled the production of a flexible $IrO_2$ nanowire nonwoven fabric having a nanostructure transferred entirely from a nanostructure of the polymer nonwoven fabric. Furthermore, it was found that the nonwoven fabric structure formed of $IrO_2$ nanowires was constructed of aggregates of $IrO_2$ nanoparticles having a diameter of 3 to 10 nm.

Figures 6A, 6B, 6C, 6D, 6E, 6F, 6G, 6H:
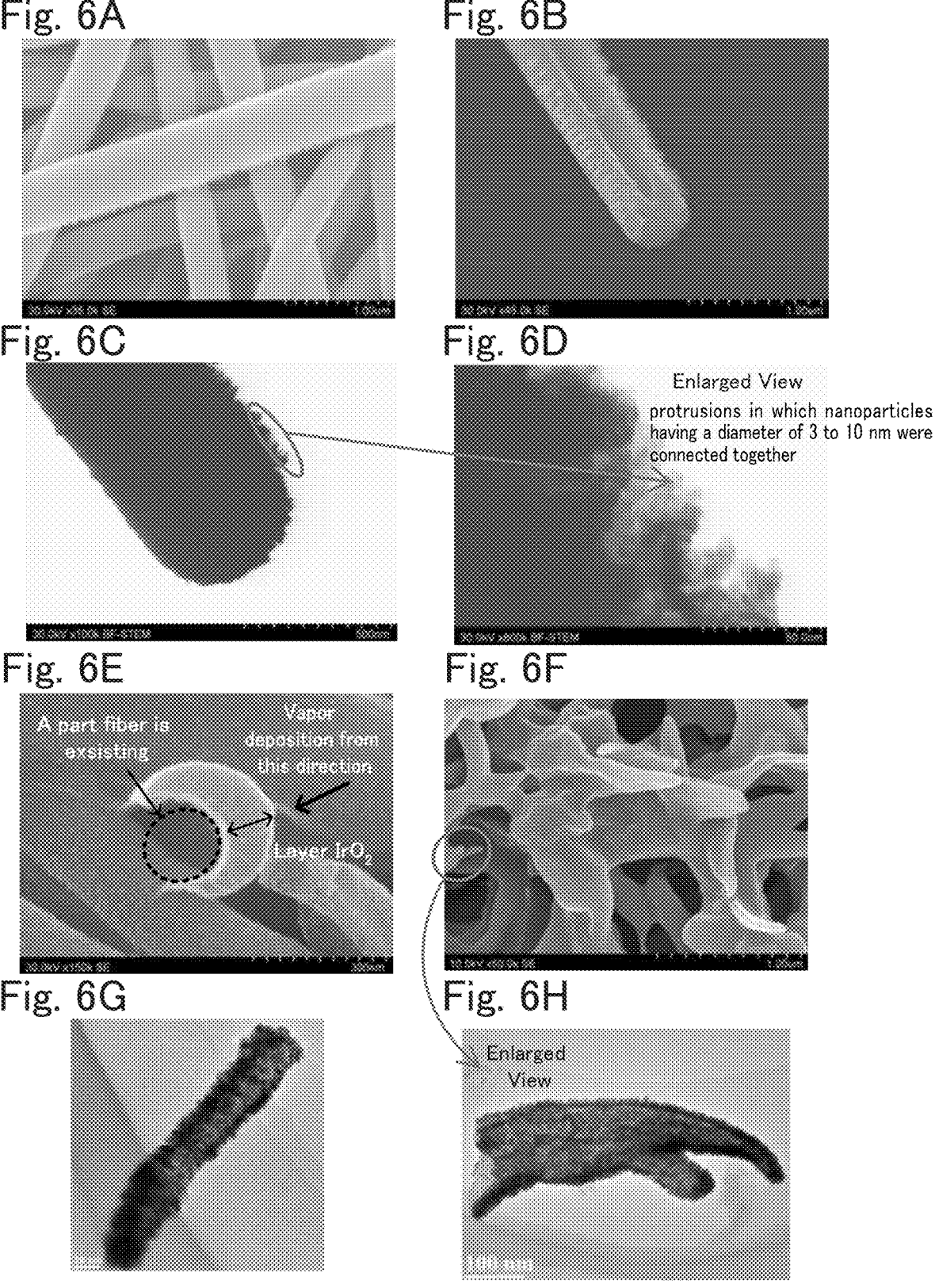
FIGS. 6A to 6H show the results of examinations of Reference Examples 3 and 4.

FIGS. 6A to 6H show the results of the examination of Reference Examples 3 and 4. FIG. 6A is an SEM image of the sputtered surface of the $IrO_2$ nanowire nonwoven fabric (Reference Example 3), and FIG. 6B is an SEM image of the back surface, opposite to the sputtered surface, of Example 3. Furthermore, FIG. 6C is a low-magnification STEM image of Reference Example 3, and FIG. 6D is a high-magnification STEM image (enlarged view) of Reference Example 3. Furthermore, FIG. 6E is an SEM image of a cross section of Reference Example 3. Furthermore, FIG. 6F is an STEM image of Reference Example 2, FIG. 6G is an STEM image of Reference Example 4, and FIG. 6H is a TEM image of a portion taken from the $IrO_2$ nanowire non woven fabric shown in FIG. 6F. From FIG. 6A to FIG. 6E, the following findings were made. In Reference Example 3, the sputtering of $IrO_2$ was performed on one side of the polymer nonwoven fabric, and as a result, the $IrO_2$ nanowires had a semi-tubular shape (see FIGS. 6A, 6B, and 6E). Furthermore, protrusions in which nanoparticles having a diameter of 3 to 10 nm were connected together were formed on surfaces of the $IrO_2$ nanowires (see FIGS. 6C and 6D).

Furthermore, as shown in FIG. 6G, it was found that even in the instance where very thin polymer nanowires having a diameter of approximately 10 to 20 nm were used as the template, the production method described above enabled the production of a structure body having a nonwoven fabric structure. From FIGS. 6F and 6H, the following findings were made. It was found that the production method described above enabled the production of a structure body having a porous membrane structure and being constructed of Pt nanoparticles having a diameter of 3 to 10 nm, with the structure body having a nanostructure transferred entirely from a nanostructure of the polymer membrane filter.

Reference Examples 5 to 11

A polymer nonwoven fabric was prepared by using a small electrospinning apparatus. A metal free-standing structure was formed on a surface of the polymer nonwoven fabric by using a small desktop sputtering system (an MC 1000 ion sputtering system, manufactured by Hitachi High-Technologies Corporation). Subsequently, the polymer nonwoven fabric was removed, and thus a structure body was obtained. For the sputtering, metal targets, namely Pt, Au, Ag, Cu, Sn, Ru, and Ir targets, were used, and the obtained respective structure bodies were designated as Reference Examples 5 to 11. The nonwoven fabric made of PVP nanofibers having a diameter of 100 to 200 nm, which was used as the template, was prepared by electrospinning a 10 mass % solution of PVP in methanol at 1 kV/cm. Sputter vapor deposition was performed on the surface by using each of the metal targets, and subsequently, the PVP nanofiber nonwoven fabric used as the template was removed by being stirred in a 0.5 M solution of $NaBH_4$ (solvent: a 1:1 mixture of water and ethanol) for 30 minutes. Note that the sputtering was performed in an inert atmosphere (Ar gas).

Figure 7:
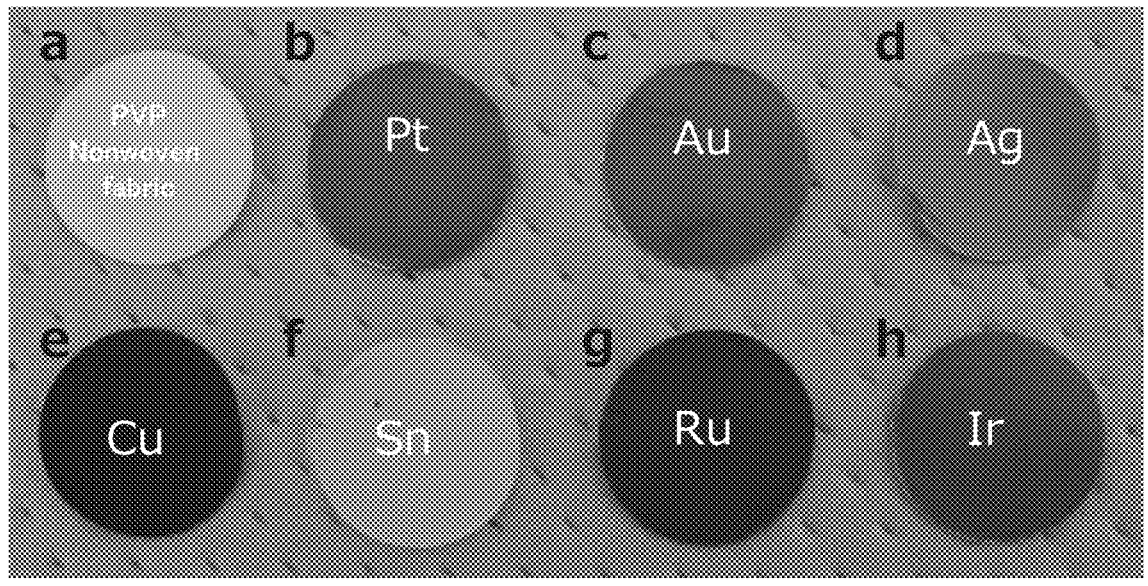
FIG. 7 is a photograph showing a nonwoven fabric, which was used as a substrate, and also showing structure bodies of Reference Examples 5 to 11, in which the nonwoven fabric was not yet removed.
Figure 8:
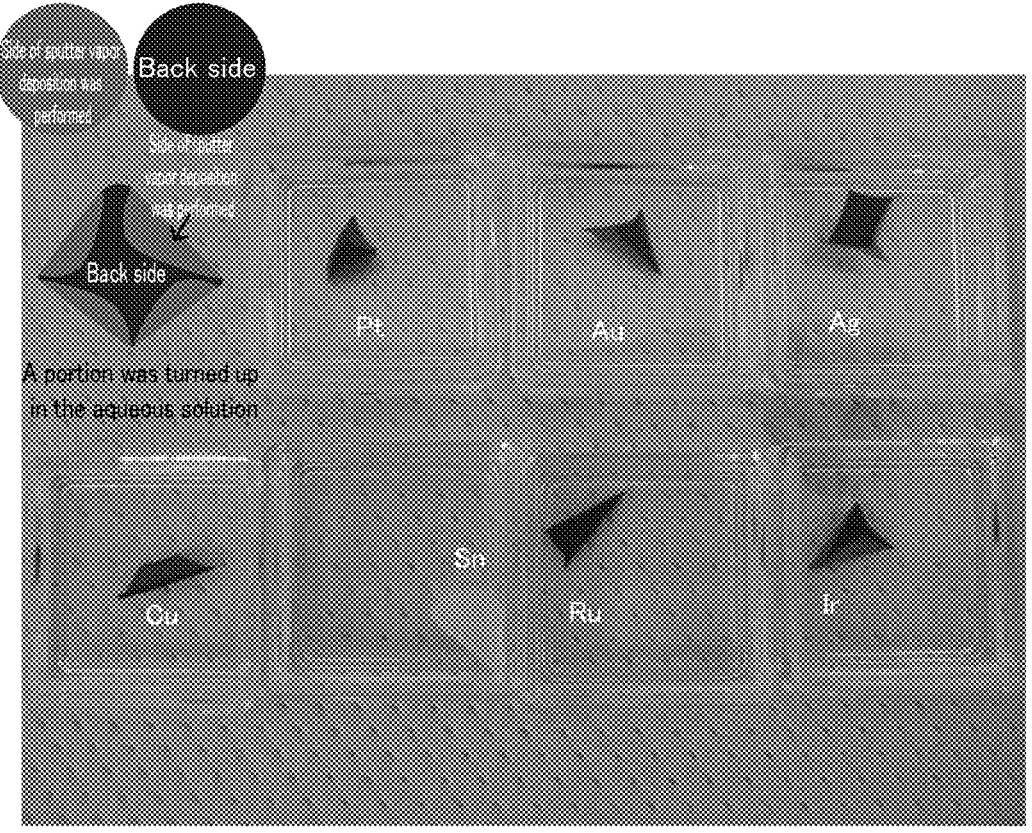
FIG. 8 is a photograph showing the structure bodies of Reference Examples 5 to 11, which have a nonwoven fabric structure, with the structure bodies shown as being placed in an aqueous solution.
Figures 9A, 9B, 9C, 9D, 9E, 9F, 9G:
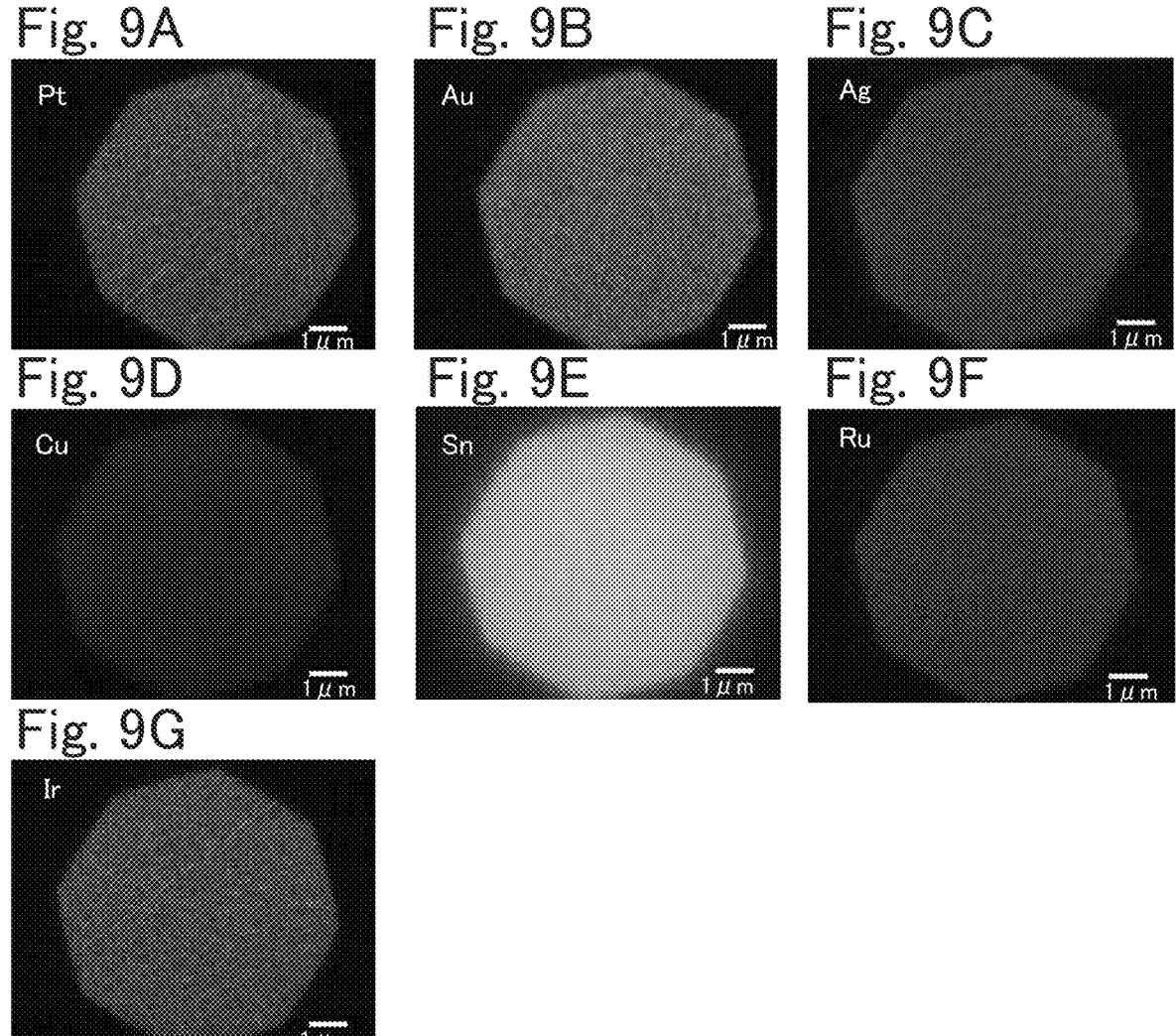
FIGS. 9A to 9G present optical photomicrographs of Reference Examples 5 to 11.

FIG. 7 is a photograph showing the nonwoven fabric used as the substrate and also showing the structure bodies of Reference Examples 5 to 11, in which the nonwoven fabric was not yet removed. FIG. 8 is a photograph showing the structure bodies of Reference Examples 5 to 11, which had a nonwoven fabric structure, with the structure bodies shown as being placed in the aqueous solution. FIGS. 9A to 9G present optical photomicrographs of Reference Examples 5 to 11 (FIGS. 9A to 9G). In the photograph of FIG. 8, the structure bodies, in which the nonwoven fabric had already been removed in the aqueous solution, are shown. The structure bodies were in a state in which a portion thereof was turned up in the aqueous solution. As shown in FIGS. 7 to 9, it was found that even with the use of a metal, a structure body (nanostructured fabric) that is flexible and has a free-standing structure having a nonwoven fabric structure can be produced, with the metal being any of a variety of metals, such as Pt, Au, Ag, Ru, and Ir, which are noble metals, Cu, which is a transition metal, and Sn, which is a main group metal. In particular, noble metals and transition metals can be used in devices that utilize their catalytic ability, and metals having high electrical conductivity (e.g., Cu and Sn) can be used in devices for electrode members, current collection members, and electrically conductive members of power storage devices and drive devices. In particular, the above-described structure bodies have a very small thickness and flexibility and are, therefore, advantageous in that the structure bodies can be readily utilized in various devices.

Experimental Examples 1 to 6

As in Reference Examples 5 to 11, a PVP nonwoven fabric was prepared by electrospinning an 8 mass % solution of PVP in methanol. By using the PVP nonwoven fabric as the substrate, a Ag structure body, a $Cu_2O$ structure body, a Ag—$Cu_2O$ (single) structure body, a Ag—$Cu_2O$ (double) structure body, a Ag—$Cu_2O$ (triple) structure body, and a Ag—$Cu_2O$ (quadruple) structure body were produced. The respective structure bodies were designated as Experimental Examples 1 to 6. In Experimental Example 1, the formation of Ag on the PVP nonwoven fabric was carried out by performing sputtering with a Ag target in an inert, atmosphere (Ar gas). The formed Ag single layer had a weight of approximately 5 μg per $cm^2$ of the PVP nonwoven fabric. In Experimental Example 2, the formation of $Cu_2O$ on the PVP nonwoven fabric was carried out by performing sputtering with a $Cu_2O$ target in an argon atmosphere and subsequently performing an oxidation treatment in air at 300 K for 10 minutes to form the $Cu_2O$ layers. The formed $Cu_2O$ single layer had a weight of approximately 10 μg per $cm^2$ of the PVP nonwoven fabric. In Experimental Example 3, the formation of Ag—$Cu_2O$ (a multi-layer structure formed of the light-absorbing layer and the dielectric layer) on the PVP nonwoven fabric was carried out by forming Ag (light-absorbing layer) on the PVP nonwoven fabric as in Experimental Example 1 and subsequently, as in Experimental Example 2, forming $Cu_2O$ (dielectric layer) on the Ag, which was formed earlier; this process was performed once, and, accordingly, one Ag—$Cu_2O$ multi-layer structure was formed. In Experimental Example 4, the formation of Ag—$Cu_2O$ on the PVP nonwoven fabric was carried out by performing twice a process of forming Ag—$Cu_2O$ similar to that of Experimental Example 3; accordingly, two Ag—$Cu_2O$ multi-layer structures were formed. In Experimental Example 5, the formation of Ag—$Cu_2O$ on the PVP nonwoven fabric was carried out by performing three times a process of forming Ag—$Cu_2O$ similar to that of Experimental Example 3; accordingly, three Ag—$Cu_2O$ multi-layer structures were formed. In Experimental Example 6, the formation of Ag—$Cu_2O$ on the PVP nonwoven fabric was carried out by performing four times a process of forming Ag—$Cu_2O$ similar to that of Experimental Example 3; accordingly, four Ag—$Cu_2O$ multi-layer structures were formed. All of the fabrics having s free-standing structure of Experimental Examples 1 to 6 had flexibility.

Evaluation of Experimental Examples 1 to 6

SEM Examination and Component Analysis

Figure 10A:
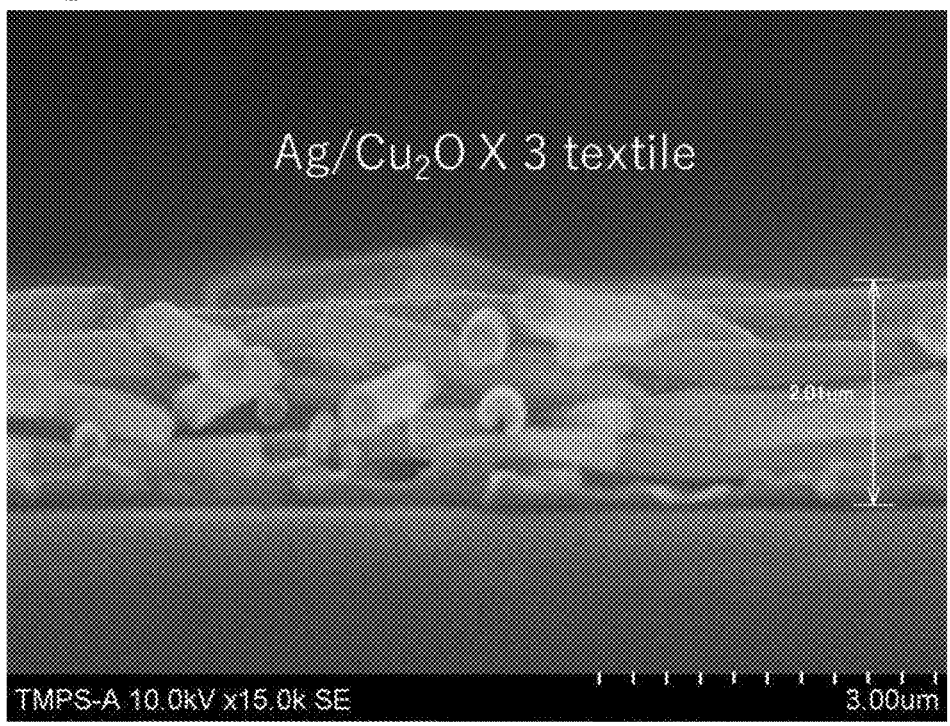
FIGS. 10A and 10B are SEM photographs of a free-standing structure body of Experimental Example 5.
Figure 10B:
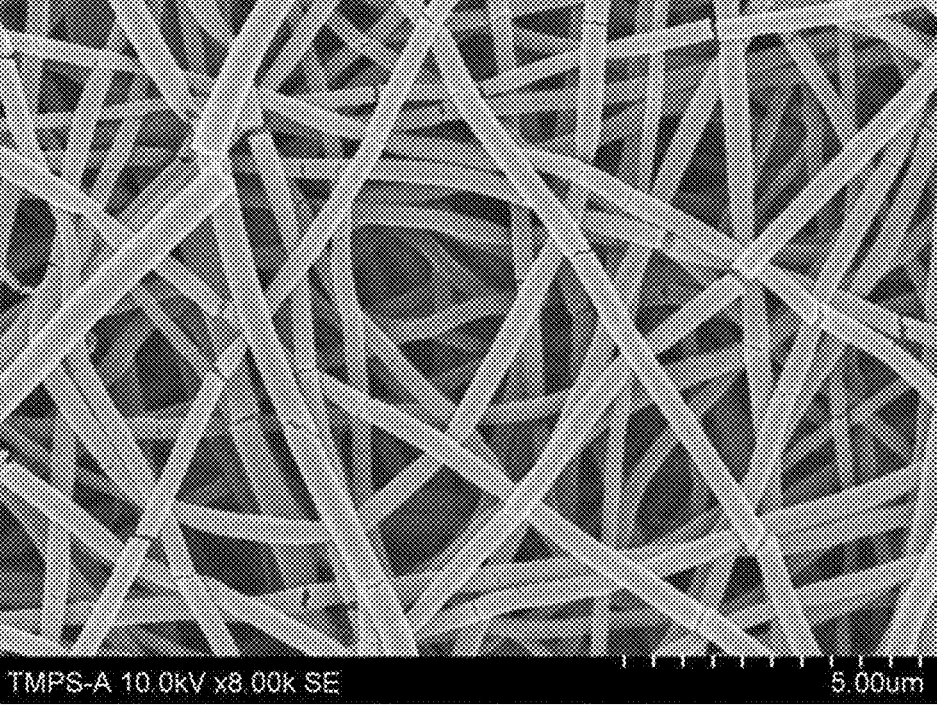

A microstructure of the produced structure body of Experimental Example 3 was examined with a scanning electron microscope (an FE 5500 SEM, manufactured by Hitachi High-Technologies Corporation), and component analysis of the structure body was performed by using energy dispersive X-ray spectroscopy (EDX). FIGS. 10A and 10B are SEM photographs (secondary electron image) of the structure body of Experimental Example 5. FIG. 10A is an SEM photograph of the sputtered surface of the structure body, and FIG. 10B is an SEM photograph of a cross section (a cross section perpendicular to the sputtered surface) of the structure body. From FIGS. 10A and 10B, the following findings were made. It was found that the production method described above enabled the production of a structure body having a nanostructure transferred entirely from a nanostructure of the polymer nonwoven fabric.

Figure 11A:
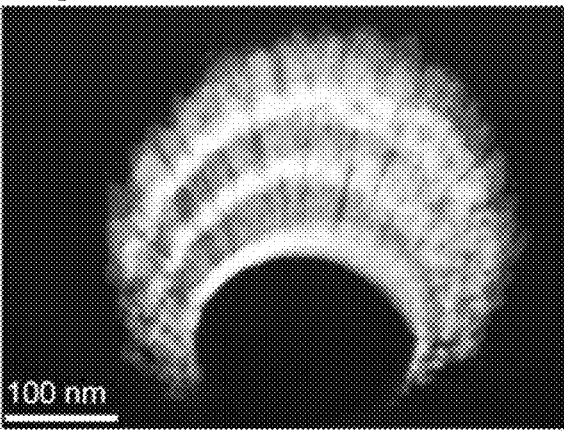
FIGS. 11A to 11F present TEM photographs of a cross section of a layered body, which constituted the free-standing structure body of Experimental Example 5, and FIGS. 11A to 11F also present the results of component analysis of the cross section.
Figure 11B:
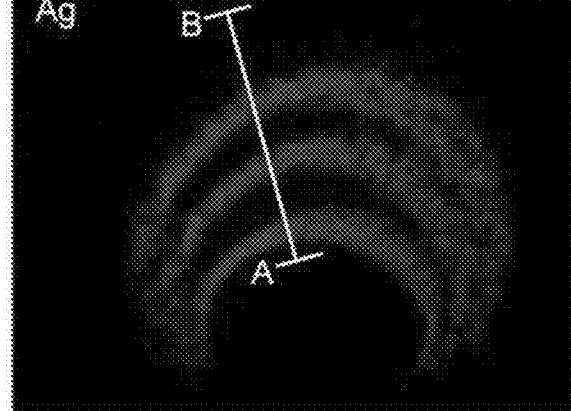
Figure 11C:
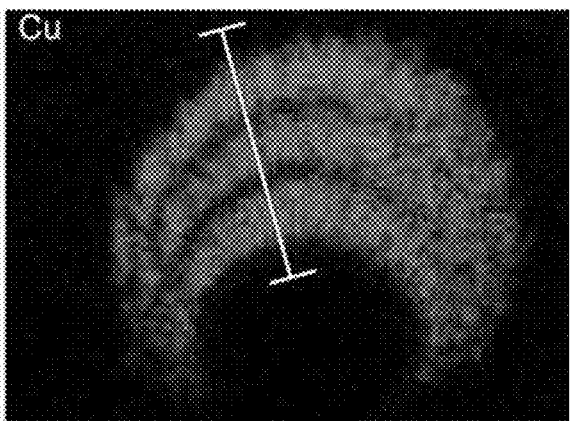
Figure 11D:
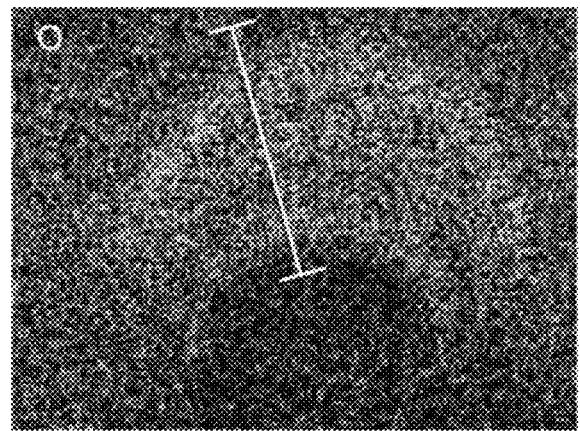
Figure 11E:
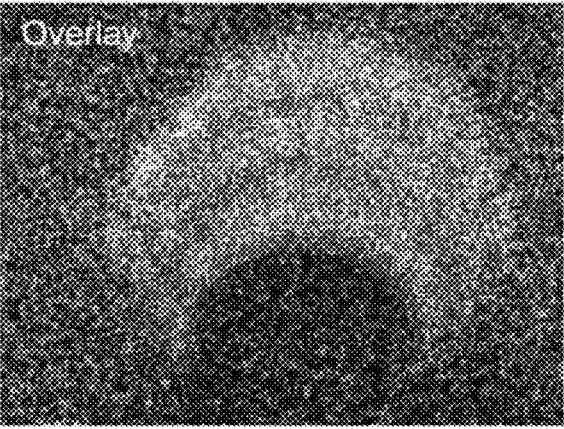
Figure 11F:
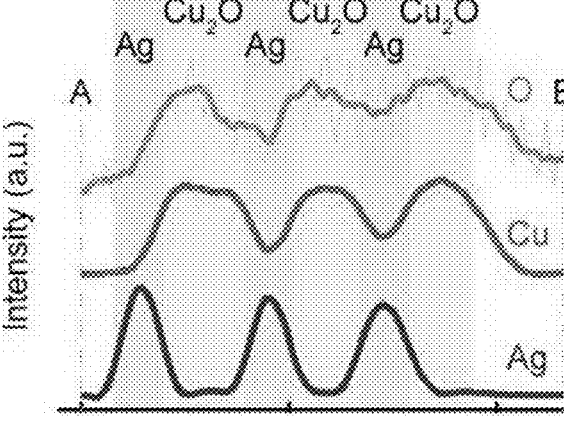

Furthermore, in Experimental Example 5, the sputtering of Ag and $Cu_2O$ was performed on one side of the polymer nonwoven fabric, and as a result, the Ag—$Cu_2O$ layered body had a semi-tubular shape. FIGS. 11A to 11F present TEM photographs of a cross section of the layered body that constituted the structure body of Experimental Example 5, and FIGS. 11A to 11F also present the results of the component analysis of the cross section. FIG. 11A is a TEM photograph of the cross section of the layered body, FIG. 11B is a Ag mapping image of the cross section of the layered body, FIG. 11C is a Cu mapping image of the cross section of the layered body, FIG. 11D is an O mapping image of the cross section of the layered body, FIG. 11E is an image obtained by overlaying the mapping images of FIG. 11B to FIG. 11D, and FIG. 11F is a graph illustrating EDX intensity distributions, which are intensity distributions along a line AB shown in FIG. 11B to FIG. 11D. From FIGS. 11A to 11F, the following findings were made. The production method described above enabled the production of a structure body including a layered body in which Ag layers, which were three layers, and $Cu_2O$ layers, which were three layers, were alternately formed. In the layered body, each of the deposited Ag layers had a thickness of approximately 5 nm, and each of the deposited $Cu_2O$ layers had a thickness of approximately 17 nm. In the layered body, the Ag layers were constructed of Ag nanoparticles having a diameter of 3 to 10 nm, and the $Cu_2O$ layers were constructed of aggregates of $Cu_2O$ nanoparticles having a diameter of 3 to 10 nm. Furthermore, in the layered body, protrusions in which nanoparticles having a diameter of 3 to 10 nm were connected together were formed on surfaces of each of the layers.

Photothermal Conversion Property

Figure 12:
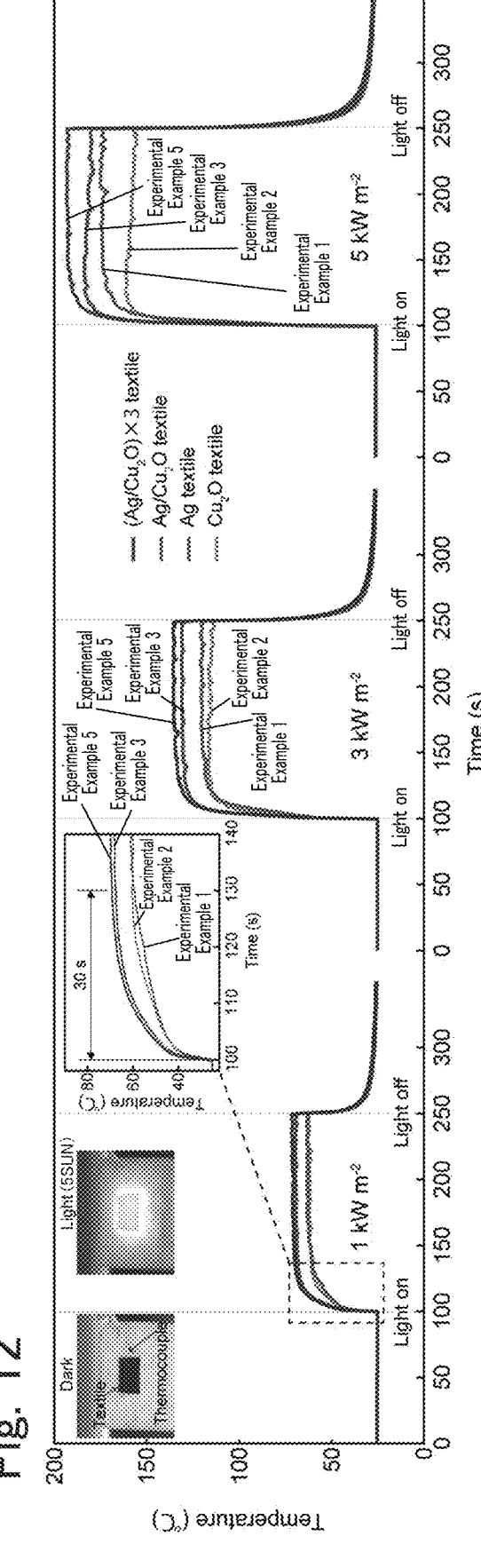
FIG. 12 is a graph illustrating temperature changes that occurred under simulated sunlight radiation in Experimental Examples 1 to 3 and 5.
Figure 13:
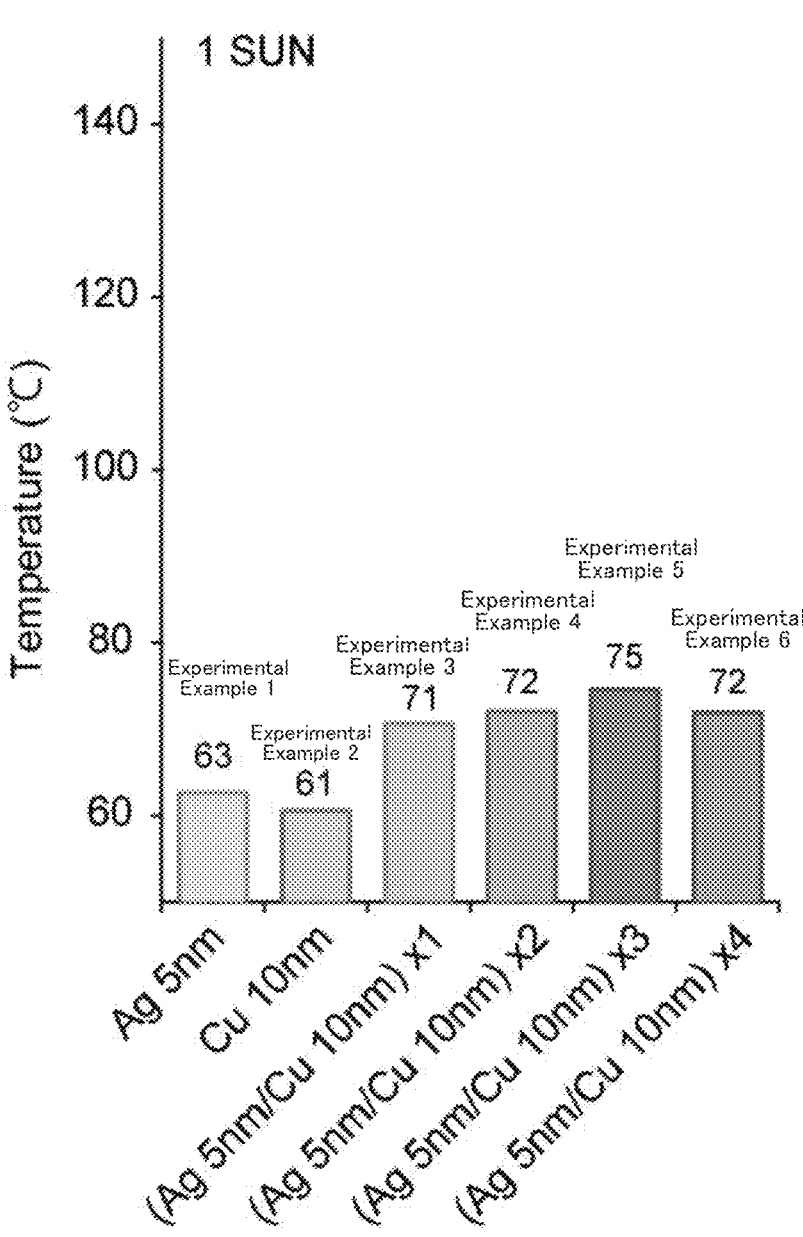
FIG. 13 is a graph illustrating the temperatures reached when the radiation of simulated sunlight lasted for 30 seconds in Experimental Examples 1 to 6.

Next, regarding Experimental Examples 1 to 6, a photothermal conversion property for converting absorbed light into heat was evaluated. The photothermal conversion property was evaluated as follows. The structure bodies of Experimental Examples 1 to 6 were scooped up with a polystyrene foam, simulated sunlight was radiated to the structure bodies, and temperatures of the structure bodies under the radiation were measured by using a K-type thermocouple. The simulated sunlight was radiated at light intensities of 1 kW·m⁻², 3 kW·m⁻², and 5 kW·m⁻² by using a solar simulator (HAL-302) manufactured by Asahi Spectra. FIG. 12 is a graph illustrating temperature changes that occurred under the simulated sunlight radiation in Experimental Examples 1 to 3 and 5. FIG. 13 is a graph illustrating the temperatures reached at the time at which the radiation of simulated sunlight (a light intensity of 1 kW·m⁻² (1 sun)) lasted for 30 seconds in Experimental Examples 1 to 6. The results are summarized in Table 1. As illustrated in FIGS. 12 and 13, in the structure bodies of Experimental Examples 3 to 6, which had one or more Ag—$Cu_2O$ multi-layer structures, the temperature increased to 71° C. or greater in 30 seconds, even with the radiation of visible light with an intensity of 1 kW·m⁻². Furthermore, among the structure bodies of Experimental Examples 3 to 6, which had one or more Ag—$Cu_2O$ multi-layer structures, the structure body of Experimental Example 5, which had three Ag—$Cu_2O$ multi-layer structures, experienced the largest increase in the temperature over the 30 seconds of light radiation. Thus, it was found that heating due to light absorption could be accomplished quickly in the structure bodies having one or more Ag—$Cu_2O$ multi-layer structures (layered body), and heating due to light absorption could be accomplished more quickly in the structure body having three Ag—Cu$_2$O multilayer structures.

7. The structure body according to claim 1, wherein the layered body includes light-absorbing layers and dielectric layers that are alternately disposed, the light-absorbing lay-

TABLE 1

| Experimental example | Light-absorbing layers | | | | Dielectric layers | | | | Layered body | | |
| | Light-absorbing material | Thickness[1] nm | Weight[2] μg/cm² | Numbers of layers layers | Dielectric material | Thickness[1] nm | Weight[2] μg/cm² | Numbers of layers layers | Thickness[3] nm | Weight[4] μg/cm² | Temperature[5] ° C. |
|---|---|---|---|---|---|---|---|---|---|---|---|
| 1 | Ag | 5 | 5 | 1 | Nil | 0 | 0 | 0 | 5 | 5 | 63 |
| 2 | Nil | 0 | 0 | 0 | Cu$_2$O | 17 | 10 | 1 | 17 | 10 | 61 |
| 3 | Ag | 5 | 5 | 1 | Cu$_2$O | 17 | 10 | 1 | 22 | 15 | 71 |
| 4 | Ag | 5 | 5 | 2 | Cu$_2$O | 17 | 10 | 2 | 44 | 30 | 72 |
| 5 | Ag | 5 | 5 | 3 | Cu$_2$O | 17 | 10 | 3 | 66 | 45 | 75 |
| 6 | Ag | 5 | 5 | 4 | Cu$_2$O | 17 | 10 | 4 | 88 | 60 | 72 |

[1]Thickness of 1 layer
[2]Weight of 1 layer (Per cm2 of PVP nonwoven fabric)
[3]Thickness of 1 layer of light-absorbing layer × number of layers + Thickness of 1 layer of Dielectric layer × number of layers
[4]Weight of 1 layer of light-absorbing layer × number of layers + Weight of 1 layer of Dielectric layer × number of layers
[5]Temperatures reached when 1SUN × 30 seconds lasted While examples of the present disclosure have been described in detail in the foregoing description, the present disclosure is in no way limited to the examples described above, and various modifications may be made within the scope that does not depart from the gist of the present disclosure.

This specification refers to Japanese Patent Application No. 2021-084075, filed in Japan on May 18, 2021, the disclosure of which, including the specification, the drawings and the claims, is incorporated herein in its entirety.

What is claimed is:

1. A structure body comprising a free-standing structure including at least one of a fibrous member or a shell, the at least one of the fibrous member or the shell being a layered body formed of at least one light-absorbing layer and at least one dielectric layer, the at least one light-absorbing layer and the at least one dielectric layer being in contact with each other, and the at least one of the fibrous member or the shell having a three-dimensionally continuous configuration, the at least one light-absorbing layer including a light-absorbing material that has an absorption in a visible light region, and the at least one dielectric layer including a dielectric material.

2. The structure body according to claim 1, wherein the light-absorbing material is metal nanoparticles containing at least one of Au, Ag, Cu, or Al.

3. The structure body according to claim 1, wherein the dielectric material is at least one of Cu$_2$O, TiO$_2$, Fe$_2$O$_3$, SiO$_2$, Si, or Ge.

4. The structure body according to claim 1, wherein the light-absorbing material is metal nanoparticles having a diameter of 1 nm or greater and 60 nm or less.

5. The structure body according to claim 1, wherein the at least one dielectric layer has a single layer thickness of 5 nm or greater and 70 nm or less.

6. The structure body according to claim 1, wherein the layered body includes light-absorbing layers and dielectric layers that are alternately disposed, the light-absorbing layers are two or more and four or fewer layers identical to the at least one light-absorbing layer, and the dielectric layers are two or more and four or fewer layers identical to the at least one dielectric layer.

ers are three layers identical to the at least one light-absorbing layer, and the dielectric layers are three layers identical to the at least one dielectric layer.

8. The structure body according to claim 1, wherein the light-absorbing material is nanoparticles containing Ag, and the dielectric material is Cu$_2$O.

9. The structure body according to claim 1, wherein, in the layered body, a total thickness of the at least one light-absorbing layer is 5 nm or greater and 20 nm or less, and a total thickness of the at least one dielectric layer is 20 nm or greater and 70 nm or less.

10. The structure body according to claim 1, wherein the structure body has a sheet shape and has a weight per cm² of 15 μg or greater and 60 μg or less.

11. The structure body according to claim 1, wherein the layered body is a semi-tubular nanowire having a diameter of less than or equal to 500 nm.

12. The structure body according to claim 1, wherein the free-standing structure is a flexible nonwoven fabric structure including the layered body, and the layered body is a semi-tubular nanowire and has a three-dimensionally continuous configuration.

13. A device comprising the structure body according to claim 1, the structure body serving as a photothermal conversion material that absorbs visible light and converts the visible light into heat.

14. The device according to claim 13, further comprising a support body that has a liquid absorbing property and a thermal insulation property, a first surface of the support body being in contact with the structure body, a second surface of the support body being to be in contact with a liquid, wherein the device is a device that evaporates the liquid by using the heat converted by the structure body.

15. A method for manufacturing a structure body, the method comprising:

a forming step including forming a layered body on a surface of a substrate that includes a polymer, to form a free-standing structure including at least one of a fibrous member or a shell, the layered body being formed of at least one light-absorbing layer and at least one dielectric layer, the at least one light-absorbing layer and the at least one dielectric layer being in contact with each other, the at least one light-absorbing layer including a light-absorbing material that has an absorption in a visible light region, the at least one dielectric layer including a dielectric material, the at least one of the fibrous member or the shell being the layered body and having a three-dimensionally continuous configuration; and a removing step including removing all or a portion of the substrate.

16. The method for manufacturing a structure body according to claim 15, wherein, in the forming step, a nonwoven fabric or a porous membrane is used as the substrate.

17. The method for manufacturing a structure body according to claim 15, wherein, in the forming step, the at least one light-absorbing layer is formed to include, as the light-absorbing material, nanoparticles containing at least one of Au, Ag, Cu, or Al.

18. The method for manufacturing a structure body according to claim 15, wherein, in the forming step, the at least one dielectric layer is formed to include, as the dielectric material, at least one of $Cu_2O$, $TiO_2$, $Fe_2O_3$, $SiO_2$, Si, or Ge.

19. The method for manufacturing a structure body according to claim 15, wherein, in the forming step, the layered body is formed by using physical vapor deposition.

20. The method for manufacturing a structure body according to claim 15, wherein, in the forming step, light-absorbing layers and dielectric layers are alternately formed, the light-absorbing layers being two or more and four or fewer layers identical to the at least one light-absorbing layer, the dielectric layers being two or more and four or fewer layers identical to the at least one dielectric layer.

\* \* \* \* \*